(12) United States Patent
Hwang et al.

(10) Patent No.: US 11,967,574 B2
(45) Date of Patent: Apr. 23, 2024

(54) MEMORY DEVICE AND DATA STORAGE SYSTEM INCLUDING THE SAME

(71) Applicant: SAMSUNG ELECTRONICS CO., LTD., Suwon-si (KR)

(72) Inventors: Sungmin Hwang, Hwaseong-si (KR); Jiwon Kim, Seoul (KR); Jaeho Ahn, Seoul (KR); Joonsung Lim, Seongnam-si (KR); Sukkang Sung, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 317 days.

(21) Appl. No.: 17/460,873

(22) Filed: Aug. 30, 2021

(65) Prior Publication Data
US 2022/0122933 A1 Apr. 21, 2022

(30) Foreign Application Priority Data
Oct. 21, 2020 (KR) .................. 10-2020-0137084

(51) Int. Cl.
*H01L 25/065* (2023.01)
*H01L 23/00* (2006.01)
(Continued)

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ... H01L 24/80; H01L 21/32136; H01L 24/03; H01L 24/08; H01L 25/0657; H01L 25/50; H01L 2224/08146; H01L 2224/80201; H01L 2224/80895; H01L 2224/80896; H01L 2224/08145; H01L 25/18; H01L 2924/1431; H01L 2924/14511; H01L 2224/32145; H01L 2224/48145; H10B 43/40

See application file for complete search history.

(56) References Cited

U.S. PATENT DOCUMENTS

| 10,665,580 B1 | 5/2020 | Hosoda et al. |
| 2016/0079164 A1 | 3/2016 | Fukuzumi et al. |

(Continued)

*Primary Examiner* — Thanh Y. Tran
(74) *Attorney, Agent, or Firm* — Fish & Richardson P.C.

(57) ABSTRACT

A memory device including a first structure; and a second structure on the first structure, wherein the first structure includes a first substrate; a peripheral circuit on the first substrate; a first insulating layer covering the first substrate and the peripheral circuit; and a first bonding pad on the first insulating layer, the second structure includes a second substrate; a memory cell array on a first surface of the second substrate; a second insulating layer covering the first surface of the second substrate and the memory cell array; a conductive pattern at least partially recessed from a second surface of the second substrate; and a second bonding pad on the second insulating layer, the first bonding pad is in contact with the second bonding pad, and the conductive pattern is spaced apart from the second insulating layer.

20 Claims, 16 Drawing Sheets

(51) Int. Cl.
 *H01L 25/00* (2006.01)
 *H01L 25/18* (2023.01)

(56) References Cited

U.S. PATENT DOCUMENTS

| | | |
|---|---|---|
| 2018/0261623 A1 | 9/2018 | Higashi et al. |
| 2019/0081069 A1 | 3/2019 | Lu et al. |
| 2019/0221557 A1 | 7/2019 | Kim et al. |
| 2019/0287955 A1 | 9/2019 | Iijima et al. |
| 2019/0296041 A1 | 9/2019 | Yamasaka et al. |
| 2019/0326322 A1 | 10/2019 | Tagami et al. |
| 2020/0006371 A1 | 1/2020 | Huo et al. |
| 2020/0303401 A1* | 9/2020 | Kanamori ............... H01L 25/18 |

* cited by examiner

MEMORY DEVICE AND DATA STORAGE SYSTEM INCLUDING THE SAME

CROSS-REFERENCE TO RELATED APPLICATION

Korean Patent Application No. 10-2020-0137084, filed on Oct. 21, 2020 in the Korean Intellectual Property Office, and entitled: "Memory Device and Data Storage System Including the Same," is incorporated by reference herein in its entirety.

BACKGROUND

1. Field

Embodiments relate to a memory device and a data storage system including the same.

2. Description of the Related Art

Memory devices may have high performance, a small size, and low cost. Accordingly, memory devices may have a high degree of integration.

SUMMARY

The embodiments may be realized by providing a memory device including a first structure; and a second structure on the first structure, wherein the first structure includes a first substrate; a peripheral circuit on the first substrate; a first insulating layer covering the first substrate and the peripheral circuit; and a first bonding pad on the first insulating layer, the second structure includes a second substrate; a memory cell array on a first surface of the second substrate; a second insulating layer covering the first surface of the second substrate and the memory cell array; a conductive pattern at least partially recessed from a second surface of the second substrate; and a second bonding pad on the second insulating layer, the first bonding pad is in contact with the second bonding pad, and the conductive pattern is spaced apart from the second insulating layer.

The embodiments may be realized by providing a memory device including a first structure; and a second structure on the first structure, wherein the first structure includes a first substrate; a peripheral circuit on the first substrate; a first insulating layer covering the first substrate and the peripheral circuit; and a first bonding pad on the first insulating layer and connected to the peripheral circuit, the second structure includes a second substrate; a memory cell array on a first surface of the second substrate; a second insulating layer covering the first surface of the second substrate and the memory cell array; a first conductive pattern recessed from a second surface of the second substrate into the second substrate; and a second bonding pad on the second insulating layer and connected to the first conductive pattern, the first bonding pad is in contact with the second bonding pad, and the first conductive pattern overlaps the memory cell array in a plan view.

The embodiments may be realized by providing a memory device including a first structure; and a second structure on the first structure, wherein the first structure includes a first substrate; a first transistor and a second transistor on the first substrate; a first insulating layer covering the first substrate, the first transistor, and the second transistor; a first bonding pad on the first insulating layer and connected to the first transistor; and a second bonding pad on the first insulating layer and connected to the second transistor, the second structure includes a second substrate; a memory cell array including a plurality of gate layers stacked on a first surface of the second substrate and a plurality of channel structures respectively penetrating the plurality of gate layers; a second insulating layer covering the first surface of the second substrate and the memory cell array; a conductive pattern on a second surface of the second substrate or extending at least partially from the second surface of the second substrate into the second substrate; a third bonding pad on the second insulating layer and connected to the conductive pattern; and a fourth bonding pad on the second insulating layer and connected to the conductive pattern, the first bonding pad is in contact with the third bonding pad, and the second bonding pad is in contact with the fourth bonding pad.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
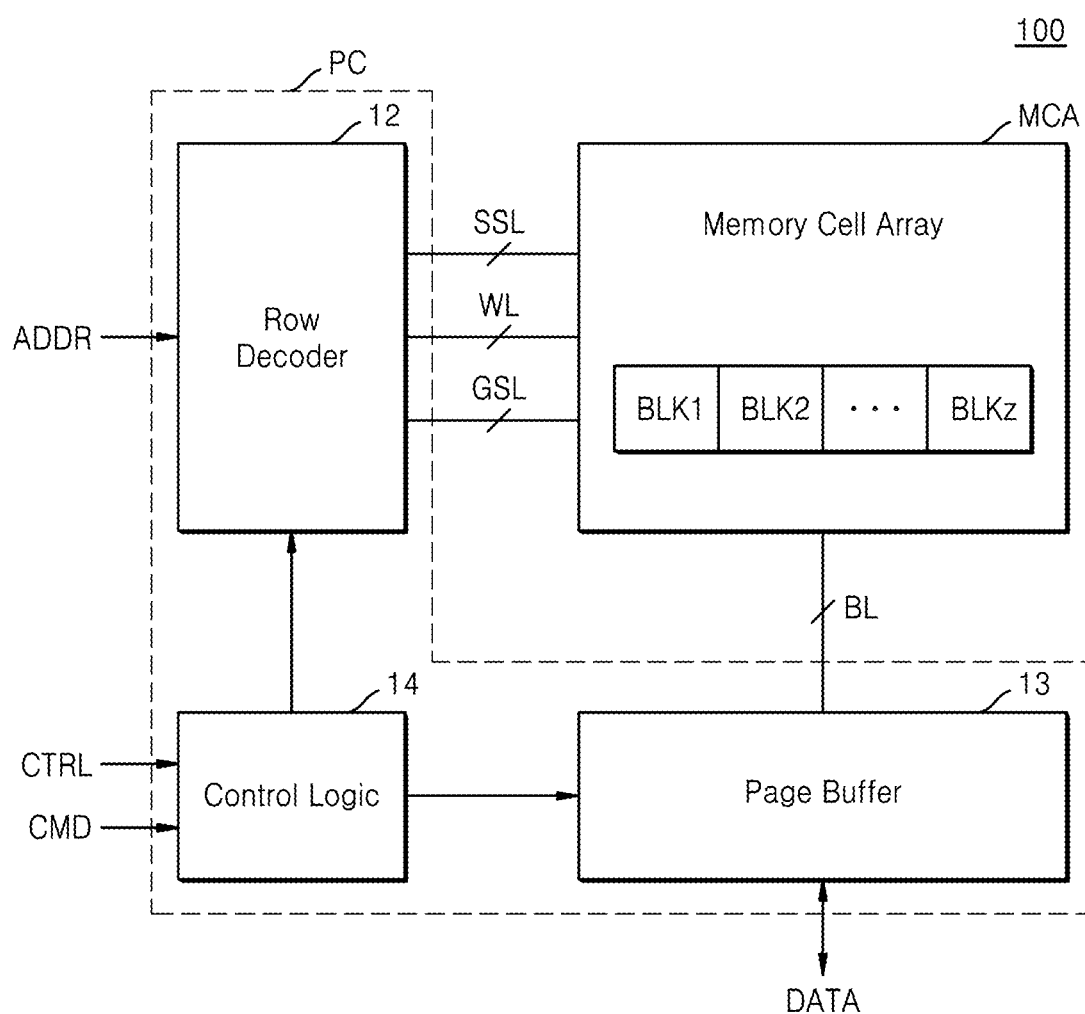
FIG. 1 is a diagram of a memory device according to an embodiment.

FIG. 1 is a diagram of a memory device 100 according to an embodiment.

Referring to FIG. 1, the memory device 100 may include a memory cell array MCA and a peripheral circuit PC. The peripheral circuit PC may include a row decoder 12, a page buffer 13, and a control logic 14.

The memory cell array MCA may include a plurality of memory blocks BLK1 to BLKz. Each of the memory blocks BLK1 to BLKz may include a plurality of memory cells capable of storing data. The memory cell array MCA may include nonvolatile memory cells that maintain stored data even when power is disconnected. In an implementation, the memory cell array MCA may include an electrically erasable programmable read-only memory (EEPROM) cell, a flash memory cell, a phase change random access memory (PRAM) cell, a resistance random access memory (RRAM) cell, a magnetic random access memory (MRAM) cell, a ferroelectric random access memory (FRAM) cell, or a combination thereof. Hereinafter, embodiments will be described in detail on the assumption that the memory cell array MCA includes NAND flash memory cells.

The row decoder 12 may be connected to the memory cell array MCA by a plurality of string select lines SSL, a plurality of word lines WL, and a plurality of ground select lines GSL. The row decoder 12 may select at least one of the plurality of blocks BLK1 to BLKz of the memory cell array MCA in response to an address ADDR provided from a memory controller. The row decoder 12 may select at least one of the word lines WL, the string select lines SSL, and the ground select lines GSL of a selected memory block in response to an address ADDR provided from a memory controller (not illustrated).

The page buffer 13 may be connected to the memory cell array MCA through a plurality of bit lines BL. The page buffer 13 may select at least one of the bit lines BL. The page buffer 13 may store data DATA, which is received from a memory controller, in the memory cell array MCA. In addition, the page buffer 13 may output the data DATA read from the memory cell array MCA to a memory controller.

The control logic 14 may control all operations of the memory device 100. In an implementation, the control logic 14 may control operations of the row decoder 12 and the page buffer 13. In an implementation, the memory device 100 may be controlled to perform a memory operation corresponding to a command CMD provided from a memory controller. In addition, the control logic 14 may generate various internal control signals used in the memory device 100 in response to a control signal CTRL provided from a memory controller.

Figure 2:
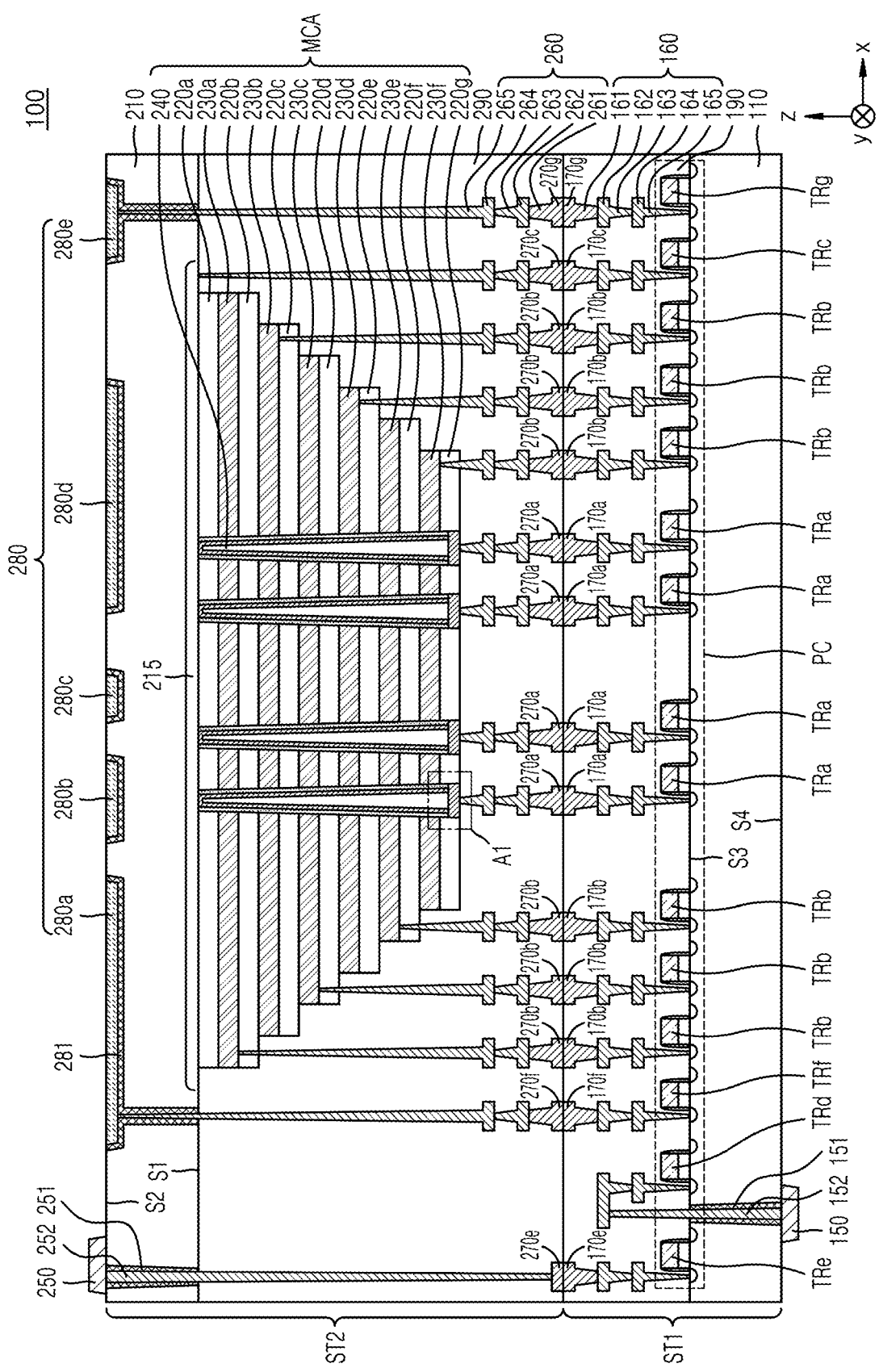
FIG. 2 is a cross-sectional view of a memory device according to an embodiment.
Figure 3:
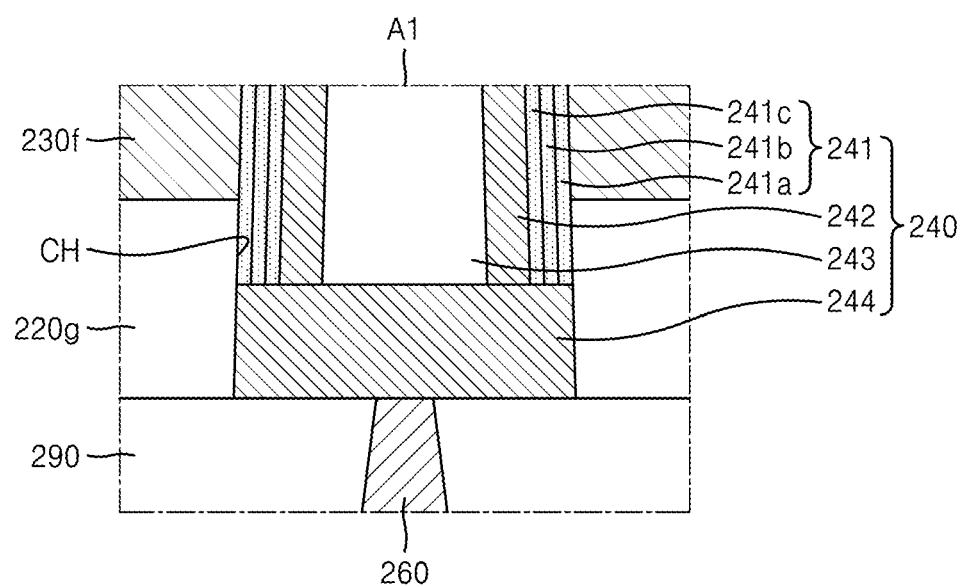
FIG. 3 is an enlarged view of a region A1 of FIG. 2.

FIG. 2 is a cross-sectional view of the memory device 100 according to an embodiment. FIG. 3 is an enlarged view of a region A1 of FIG. 2.

Referring to FIGS. 2 and 3, the memory device 100 may include a first structure ST1 and a second structure ST2 on the first structure ST1. The second structure ST2 may be coupled to the first structure ST1. In an implementation, the second structure ST2 may be in direct contact with the first structure ST1. In an implementation, a plurality of first bonding pads 170a to 170c and 170e to 170g of the first structure ST1 may be in direct contact with a plurality of second bonding pads 270a to 270c and 270e to 270g of the second structure ST2. In an implementation, a first insulating layer 190 may be in direct contact with a second insulating layer 290.

The first structure ST1 may include a first substrate 110, a peripheral circuit PC on a first surface S3 of the first substrate 110, the insulating layer 190 that covers the first substrate 110 and the peripheral circuit PC, and the plurality of first bonding pads 170a to 170c and 170e to 170g arranged on the first insulating layer 190. In an implementation, the first structure ST1 may further include a first wiring structure 160. In an implementation, the first structure ST1 may further include a first input/output pad 150 on a second surface S4 of the first substrate 110, a first input/output contact plug 152 in contact (e.g., direct contact) with the first input/output pad 150, and a first input/output insulating layer 151 between the first input/output contact plug 152 and the first substrate 110. In an implementation, the first structure ST1 may further include an insulating layer on the second surface S4 of the first substrate 110 that insulates the first input/output pad 150 from the first substrate 110.

The second structure ST2 may include a second substrate 210, a memory cell array MCA on a first surface S1 of the second substrate 210, the second insulating layer 290 that covers the first surface S1 of the second substrate 210 and the memory cell array MCA, a substrate wiring structure 280 on a second surface S2 of the second substrate 210, and the plurality of second bonding pads 270a to 270c and 270e to 270g arranged on the second insulating layer 290. In an implementation, the second structure ST2 may further include a second wiring structure 260. In an implementation, the second structure ST2 may further include a second input/output pad 250 on the second surface S2 of the second substrate 210, a second input/output contact plug 252 in contact (e.g., direct contact) with the second input/output pad 250, and a second input/output insulating layer 251 between the second input/output contact plug 252 and the second substrate 210. In an implementation, the second structure ST2 may further include an insulating layer on the second surface S2 of the second substrate 210 and the substrate wiring structure 280 that insulates the second input/output pad 250 from the second substrate 210.

The first substrate 110 may have the first surface S3 and the second surface S4 facing each other. The second substrate 210 may have the first surface S1 and the second surface S2 facing each other. Each of the first substrate 110 and the second substrate 210 may include a semiconductor material such as a Group IV semiconductor material, a Group III-V semiconductor material, or a Group II-VI semiconductor material. The Group IV semiconductor material may include, e.g., silicon (Si), germanium (Ge), or silicon (Si)-germanium (Ge). The Group III-V semiconductor material may include, for example, gallium arsenide (GaAs), indium phosphorus (InP), gallium phosphorus (GaP), indium arsenic (InAs), indium antimony (InSb), or indium gallium arsenide (InGaAs). The Group II-VI semiconductor material may include, e.g., zinc telluride (ZnTe) or cadmium sulfide (CdS). Each of the first substrate 110 and the second substrate 210 may be a bulk wafer or an epitaxial layer. As used herein, the term "or" is not an exclusive term, e.g., "A or B" would include A, B, or A and B.

In an implementation, a common source line layer 215 may be in the second substrate 210. In an implementation, the common source line layer 215 may be an impurity region in the second substrate 210. In an implementation, the common source line layer 215 may be a polysilicon layer on the first surface S1 of the second substrate 210.

Each of the first insulating layer 190 and the second insulating layer 290 may include, e.g., silicon oxide, silicon nitride, a low-k material, or an insulating material capable of including a combination thereof. The low-k dielectric material may have a lower dielectric constant than silicon oxide, e.g., phosphosilicate glass (PSG), borophosphosilicate glass (BPSG), fluorosilicate glass (FSG), organosilicate glass (OSG), spin-on-glass (SOG), spin-on-polymer, or a combination thereof.

The memory cell array MCA may include a plurality of gate layers 230a to 230f and a plurality of interlayer insulating layers 220a to 220g alternately stacked on the first surface S1 of the second substrate 210, and a plurality of channel structures 240 penetrating the plurality of gate layers 230a to 230f and the plurality of interlayer insulating layers 220a to 220g, respectively. In an implementation, as illustrated in FIG. 2, the memory cell array MCA may include six gate layers 230a to 230f and seven interlayer insulating layers 220a to 220g. In an implementation, the memory cell array MCA may include a larger number of gate layers and interlayer insulating layers.

In an implementation, the plurality of gate layers 230a to 230f may each include tungsten (W), copper (Cu), silver (Ag), gold (Au), aluminum (Al), or a combination thereof. In an implementation, each of the gate layers 230a to 230f may include titanium (Ti), tantalum (Ta), titanium nitride (TiN), tantalum nitride (TaN), or a combination thereof to help prevent the conductive material from diffusing into the plurality of interlayer insulating layers 220a to 220g, and may further include a barrier material.

The plurality of interlayer insulating layers 220a to 220g may include silicon oxide, silicon nitride, a low-k material, or an insulating material capable of including a combination thereof.

The channel structure 240 may be in a channel hole CH penetrating the plurality of gate layers 230a to 230f and the plurality of interlayer insulating layers 220a to 220g in a vertical direction (z direction). The channel structure 240 may include a gate insulating layer 241 on a side surface of a channel hole CH, a channel layer 242 on the gate insulating layer 241, a buried insulating layer 243 on the channel layer 242, and a channel pad 244 filling an end of the channel hole CH.

The gate insulating layer 241 may include a blocking insulating layer 241a, a charge storage layer 241b, and a tunneling insulating layer 241c sequentially stacked on the channel hole CH. The blocking insulating layer 241a may include, e.g., silicon oxide, silicon nitride, a metal oxide having a higher dielectric constant than silicon oxide, or a combination thereof. The metal oxide may include, e.g., hafnium oxide, aluminum oxide, zirconium oxide, tantalum oxide, or a combination thereof. The charge storage layer 241b may include, e.g., silicon nitride, boron nitride, polysilicon, or a combination thereof. The tunneling insulating layer 241c may include, e.g., metal oxide or silicon oxide. In an implementation, the blocking insulating layer 241a, the charge storage layer 241b, and the tunneling insulating layer 241c may include oxide, nitride, and oxide, respectively.

The channel layer 242 may surround a side surface and one end of the buried insulating layer 243. The channel layer 242 may include a semiconductor material, e.g., a Group IV semiconductor material, a Group III-V semiconductor material, or a Group II-VI semiconductor material. In an implementation, the channel layer 242 may include polysilicon.

The buried insulating layer 243 may fill a space surrounded by the channel layer 242 and the channel pad 244. The buried insulating layer 243 may include, e.g., silicon nitride, silicon oxide, a low-k dielectric material, or an insulating material capable of including a combination thereof. In an implementation, the buried insulating layer 243 may include silicon oxide.

The channel pad 244 may be in contact with the gate insulating layer 241, the channel layer 242, and the buried insulating layer 243. The channel pad 244 may include a semiconductor material, e.g., silicon (Si), germanium (Ge), or silicon (Si)-germanium (Ge), a metallic material such as tungsten (W), titanium (Ti), aluminum (Al), copper (Cu), gold (Au), or silver (Ag), metal nitride such as titanium nitride (TiN) or tantalum nitride (TaN), or a conductive material such as a combination thereof. In an implementation, the channel pad 244 may include polysilicon.

The substrate wiring structure 280 may include a plurality of conductive patterns 280a to 280e. Each of the conductive patterns 280a to 280e may be recessed into the second substrate 210 from the second surface S2 of the second substrate 210. In an implementation, one surface of each of the conductive patterns 280a to 280e may be coplanar with the second surface S2 of the second substrate 210. The substrate wiring structure 280 may connect components in the peripheral circuit PC to each other or connect the peripheral circuit PC to the memory cell array MCA.

The first conductive pattern 280a to the fourth conductive pattern 280d may overlap the memory cell array MCA in a plan view (e.g., when viewed along the z direction perpendicular to an x-y plane). The fifth conductive pattern 280e may not overlap the memory cell array MCA in a plan view.

The second structure ST2 may further include a plurality of insulating patterns 281 that insulate the conductive patterns 280a to 280e from the second substrate 210. Each of the insulating patterns 281 may extend between each of the conductive patterns 280a to 280e and the second substrate 210 and between a contact plug layer 265 and the second substrate 210.

Each of the conductive patterns 280a to 280e may include a conductive material, e.g., copper (Cu), aluminum (Al), tungsten (W), silver (Ag), or gold (Au). Each of the insulating patterns 281 may include, e.g., silicon nitride, silicon oxide, a low-dielectric material, or an insulating material capable of including a combination thereof.

In an implementation, the first input/output pad 150 may protrude outwardly from the second surface S4 of the first substrate 110. The first input/output pad 150 may connect the peripheral circuit PC to a memory controller. The first input/output contact plug 152 may penetrate the first substrate 110 to connect the first input/output pad 150 to the first wiring structure 160. The first input/output insulating layer 151 may insulate the first input/output contact plug 152 from the first substrate 110.

In an implementation, the second input/output pad 250 may protrude outwardly from the second surface S2 of the second substrate 210. The second input/output pad 250 may connect the peripheral circuit PC to a memory controller. The second input/output contact plug 252 may penetrate the second substrate 210 to connect the second input/output pad 250 to the second bonding pad 270e. The second input/output insulating layer 251 may insulate the second input/output contact plug 252 from the second substrate 210. In an implementation, as illustrated in FIG. 2, the second input/output contact plug 252 may penetrate the second substrate 210. In an implementation, a planar area of the second substrate 210 may be less than a planar area of the first substrate 110, and the second substrate 210 may not extend in or on a region where the second input/output contact plug 252 is arranged.

The first input/output pad 150 and the second input/output pad 250 may be selectively formed. In an implementation, the memory device 100 may include only the first input/output pad 150 or only the second input/output pad 250. In an implementation, the memory device 100 may include both the first input/output pad 150 and the second input/output pad 250.

The first input/output pad 150 and the second input/output pad 250 may each include a conductive material, e.g., copper (Cu), aluminum (Al), tungsten (W), silver (Ag), or gold (Au). The first input/output contact plug 152 and the second input/output contact plug 252 may each include a conductive material such as copper (Cu), aluminum (Al), tungsten (W), silver (Ag), or gold (Au). In an implementation, the first input/output contact plug 152 and the second input/output contact plug 252 may each further include a barrier material such as tantalum (Ta), titanium (Ti), tantalum nitride (TaN), or titanium nitride (TiN) to help prevent the conductive material from diffusing into the first insulating layer 190 and the second insulating layer 290. The first input/output insulating layer 151 and the second input/output insulating layer 251 may each include silicon nitride, silicon oxide, a low-k dielectric material, or an insulating material capable of including a combination thereof.

The first wiring structure 160 may connect the peripheral circuit PC to each of the plurality of first bonding pads 170a to 170c and 170e to 170g. The first wiring structure 160 may include a first contact plug layer 165, a first conductive line layer 164, a first via layer 163, a second conductive line layer 162, and a second via layer 161. In an implementation, as illustrated in FIG. 2, the first wiring structure 160 may include two conductive line layers, e.g., the first and second conductive line layers 164 and 162, and the two via layers, e.g., the first and second via layers 163 and 161. In an implementation, the first wiring structure 160 may include three or more conductive line layers and three or more via layers.

The first contact plug layer 165 may connect the first conductive line layer 164 to the peripheral circuit PC. The first via layer 163 may connect the second conductive line layer 162 to the first conductive line layer 164. The second via layer 161 may connect the plurality of first bonding pads 170a to 170c and 170e to 170g to the second conductive line layer 162.

The second wiring structure 260 may connect the memory cell array MCA to the plurality of second bonding pads 270a to 270c. In addition, the second wiring structure 260 may connect the substrate wiring structure 280 to the plurality of second bonding pads 270f and 270g. The second wiring structure 260 may include the second contact plug layer 265, a third conductive line layer 264, a third via layer 263, a fourth conductive line layer 262, and a fourth via layer 261. In an implementation, as illustrated in FIG. 2, the second wiring structure 260 may include two conductive line layers, e.g., the third and fourth conductive line layers 264 and 262, and two via layers, e.g., the third and fourth via layers 263 and 261. In an implementation, the second wiring structure 260 may include three or more conductive line layers and three or more via layers.

The second contact plug layer 265 may connect the third conductive line layer 264 to the memory cell array MCA. In an implementation, the second contact plug layer 265 may connect the third conductive line layer 264 to the plurality of gate layers 230a to 230f, the common source line layer 215, and the plurality of channel structures 240. In addition, the second contact plug layer 265 may connect the third conductive line layer 264 to the substrate wiring structure 280. The third via layer 263 may connect the fourth conductive line layer 262 to the third conductive line layer 264. The fourth via layer 261 may connect the plurality of second bonding pads 270a to 270c and 270e to 270g to the fourth conductive line layer 262.

The first contact plug layer 165, the first conductive line layer 164, the first via layer 163, the second conductive line layer 162, the contact plug layer 265, the third conductive line layer 264, the third via layer 263, and the fourth conductive line layer 262 may each include a conductive material, e.g., copper (Cu), aluminum (Al), tungsten (W), silver (Ag), or gold (Au). In an implementation, the first contact plug layer 165, the first conductive line layer 164, the first via layer 163, the second conductive line layer 162, the contact plug layer 265, the third conductive line layer 264, the third via layer 263, and the fourth conductive line layer 262 may each further include a barrier material, e.g., titanium (Ti), tantalum (Ta), titanium nitride (TiN), or tantalum nitride (TaN) to help prevent the conductive material from diffusing into the first insulating layer 190 and the second insulating layer 290.

In an implementation, the first conductive line layer 164 may be formed of tungsten (W) having a relatively high electrical resistivity, and the second conductive line layer 262 may be formed of copper (Cu) having a relatively low electrical resistivity. An additional conductive line layer between the second conductive line layer 262 and the second via layer 161 may be formed of aluminum (Al) having a relatively lower electrical resistivity.

The second via layer 161, the plurality of first bonding pads 170a to 170c and 170e to 170g, the fourth via layer 261, and the plurality of second bonding pads 270a to 270c and 270e to 270g may each include copper (Cu), gold (Au), silver (Ag), aluminum (Al), tungsten (W), titanium (Ti), tantalum (Ta), or a conductive material capable of including a combination thereof.

In an implementation, the first structure ST1 may further include one or more first dummy bonding pads on the first insulating layer 190. In an implementation, the second structure ST2 may further include one or more second dummy bonding pads on the second insulating layer 290. The first dummy bonding pads may be in contact with the second dummy bonding pads, respectively. The first dummy bonding pads and the second dummy bonding pads may contribute to physical bonding between the first structure ST1 and the second structure ST2 and may not contribute to an electrical connection between the first structure ST1 and the second structure ST2.

The peripheral circuit PC may include a plurality of transistors TRa to TRg on the first substrate 110. Each of the first transistors TRa may be connected to the channel pad 244 of the channel structure 240 through the first wiring structure 160, the first bonding pad 170a, the second bonding pad 270a, and the second wiring structure 260. The first transistor TRa may be a component of the page buffer 13 (see FIG. 1). An electrical path connecting the first transistor TRa to the channel structure 240 may form a bit line BL (see FIG. 1).

Each of second transistors TRb may be connected to one of the plurality of gate layers 230a to 230f through the first wiring structure 160, the first bonding pad 170b, the second bonding pad 270b, and the second wiring structure 260. The second transistors TRb may be components of the row decoder 12 (see FIG. 1). An electrical path connecting the second transistor TRb to one (e.g., 230a) of the plurality of gate layers 230a to 230f which is adjacent to the second substrate 210 may form the ground select line GSL (see FIG. 1). An electrical path connecting the second transistor TRb to one (for example, 230f) of the plurality of gate layers 230a to 230f which is far from the second substrate 210 may form the string select line SSL (see FIG. 1). Electrical paths connecting the plurality of second transistors TRb to the others (e.g., 230b to 230e) of the plurality of gate layers 230a to 230f may form the word lines WL (see FIG. 1).

In an implementation, an operating voltage of the second transistor TRb included in the row decoder 12 (see FIG. 1) may be different from an operating voltage of the first transistor TRa included in the page buffer 13 (see FIG. 1). In an implementation, the operating voltage of the first transistor TRa included in the page buffer 13 (see FIG. 1)

may be greater than the operating voltage of the second transistor TRb included in the row decoder 12 (see FIG. 1).

The third transistor TRc may be connected to the common source line layer 215 through the first wiring structure 160, the first bonding pad 170c, the second bonding pad 270c, and the second wiring structure 260. The third transistor TRc may be a component of a common source line driver. An electrical path connecting the third transistor TRc to the common source line layer 215 may form a common source line.

The fourth transistor TRd may be connected to the first input/output pad 150 through the first wiring structure 160 and the first input/output contact plug 152. The fourth transistor TRd may be a component of the control logic 14, the row decoder 12, or the page buffer 13.

The fifth transistor TRe may be connected to the second input/output pad 250 through the first wiring structure 160, the first bonding pad 170e, the second bonding pad 270e, and the second input/output contact plug 252. The fifth transistor TRe may be a component of the control logic 14, the row decoder 12, or the page buffer 13.

The sixth transistor TRf may be connected to the first conductive pattern 280a through the first wiring structure 160, the first bonding pad 170f, the second bonding pad 270f, and the second wiring structure 260. The seventh transistor TRg may be connected to the fifth conductive pattern 280e through the first wiring structure 160, the first bonding pad 170g, the second bonding pad 270g, and the second wiring structure 260. Each of the sixth transistor TRf and the seventh transistor TRg may be a component of the control logic 14, the row decoder 12, or the page buffer 13.

According to an embodiment, the substrate wiring structure 280 may be on the second substrate 210. The substrate wiring structure 280 may contribute to a connection between components, planar areas of the first wiring structure 160 and the second wiring structure 260 may be reduced, and accordingly, a planar area of the memory device 100 may be reduced. In addition, the flexibility in designing the first wiring structure 160 and the second wiring structure 260 may be increased. In addition, each of the conductive patterns 280a to 280e of the substrate wiring structure 280 may be recessed into the second surface S2 of the second substrate 210, and a height of the memory device 100 may not be increased. In addition, stresses in the memory device 100 may be balanced by forming the substrate wiring structure 280 with a material having a thermal expansion coefficient different from a thermal expansion coefficient of a material forming the second substrate 210, and thus, warpage of the memory device 100 may be reduced.

Figure 4:
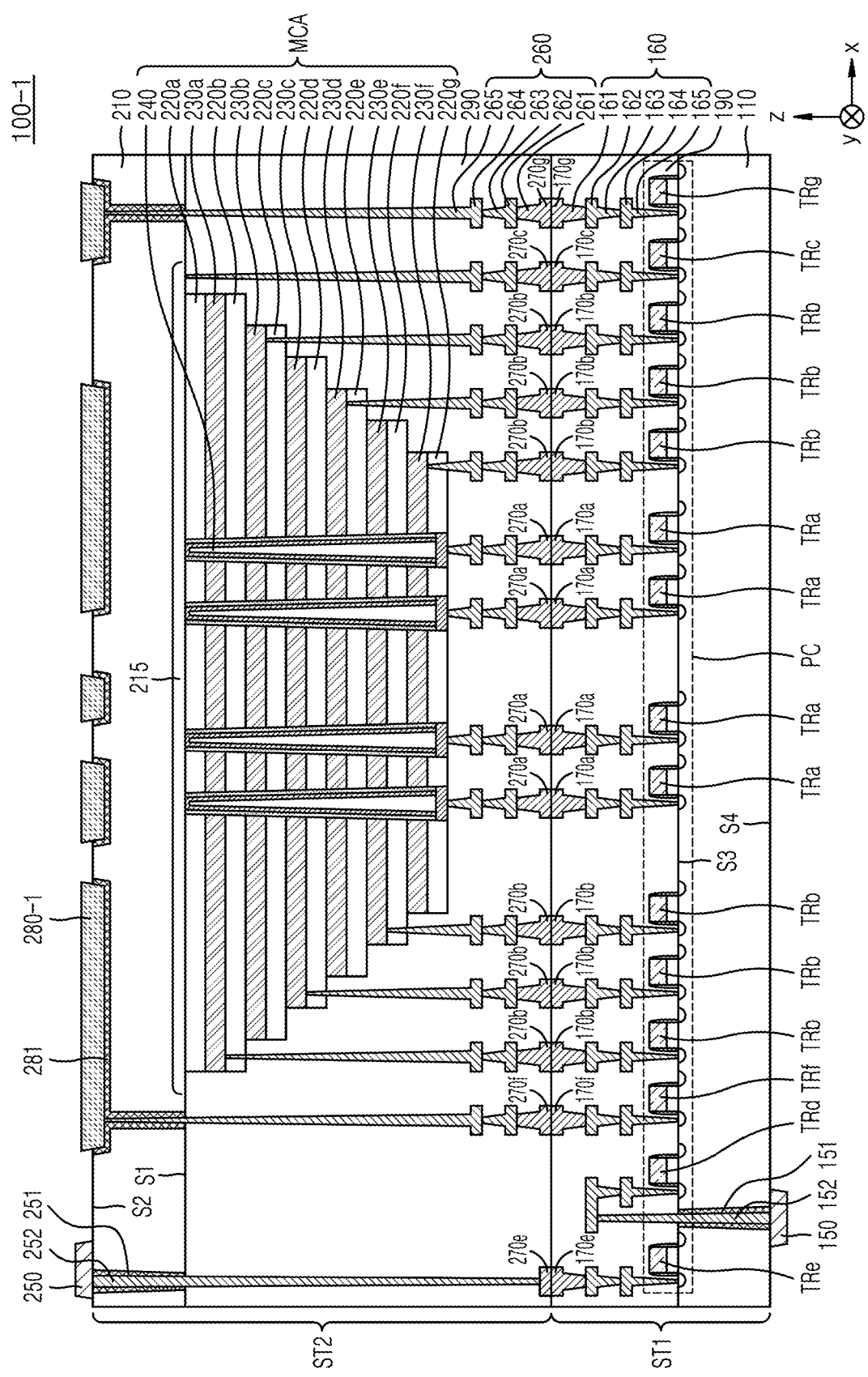
FIG. 4 is a cross-sectional view of a memory device according to an embodiment.

FIG. 4 is a cross-sectional view of a memory device 100-1 according to an embodiment. Hereinafter, a difference between the memory device 100 illustrated in FIG. 2 and the memory device 100-1 illustrated in FIG. 4 will be described.

Referring to FIG. 4, only part of a conductive pattern 280-1 may be recessed into the second substrate 210. In an implementation, the conductive pattern 280-1 may include a first portion recessed from or in the second surface S2 of the second substrate 210 and a second portion protruding outwardly from the second surface S2 of the second substrate 210.

Figure 5:
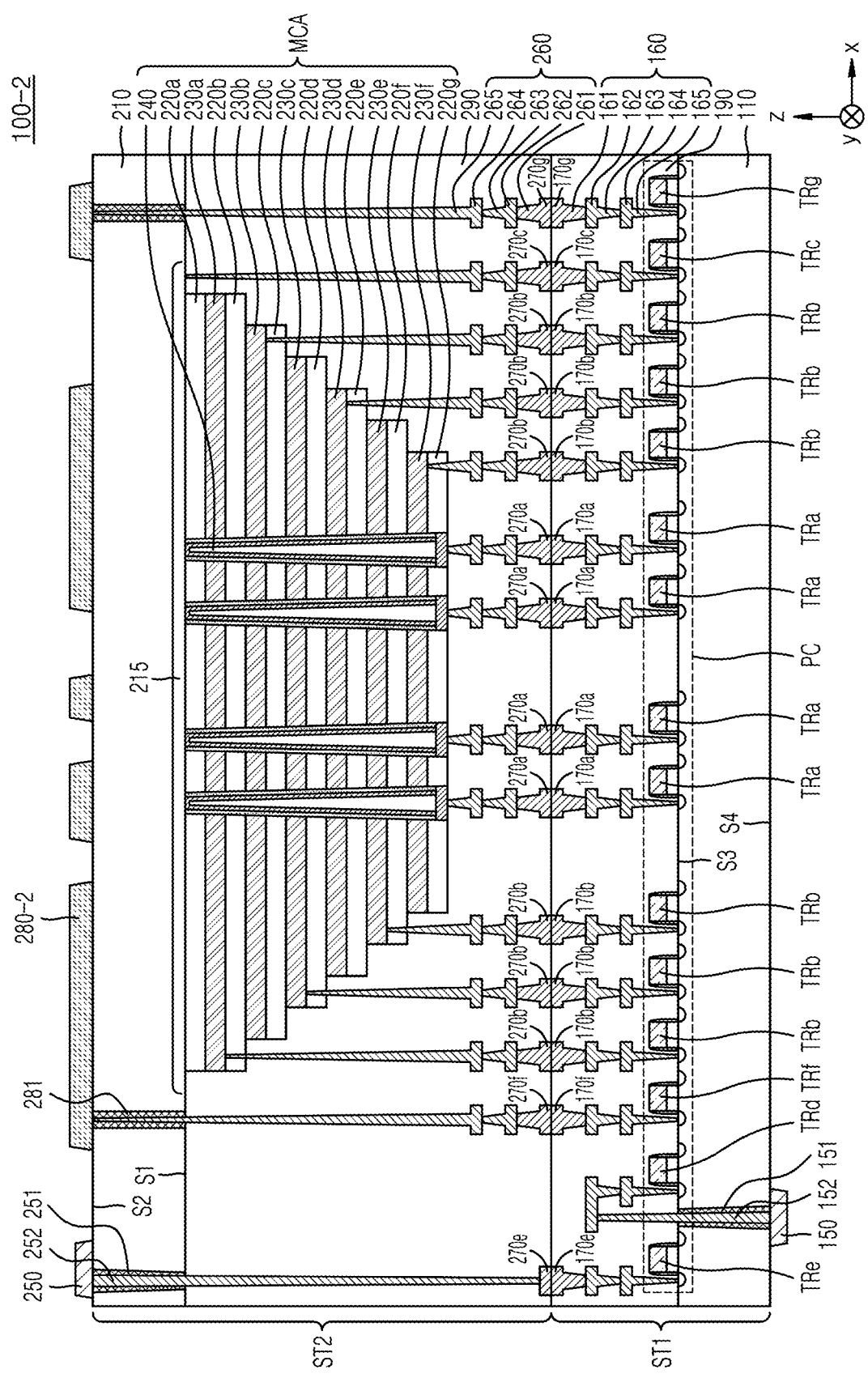
FIG. 5 is a cross-sectional view of a memory device according to an embodiment.

FIG. 5 is a cross-sectional view of a memory device 100-2 according to an embodiment. Hereinafter, a difference between the memory device 100 illustrated in FIG. 2 and the memory device 100-2 illustrated in FIG. 5 will be described.

Referring to FIG. 5, a conductive pattern 280-2 may be on the second surface S2 of the second substrate 210. The conductive pattern 280-2 may not be recessed into the second surface S2 of the second substrate 210. The conductive pattern 280-2 may protrude outwardly from the second surface S2 of the second substrate 210.

Figure 6:
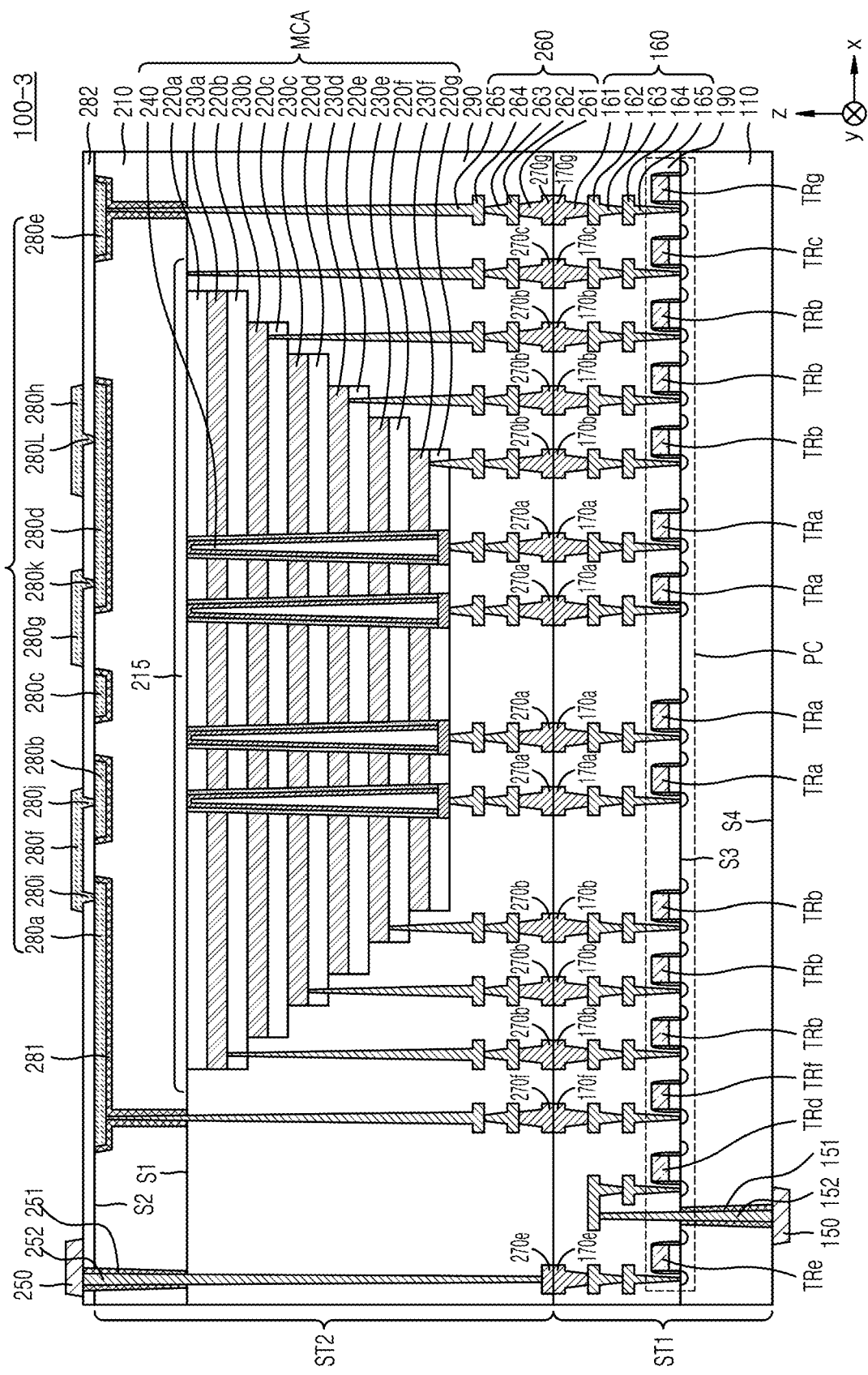
FIG. 6 is a cross-sectional view of a memory device according to an embodiment.

FIG. 6 is a cross-sectional view of a memory device 100-3 according to an embodiment. Hereinafter, a difference between the memory device 100 illustrated in FIG. 2 and the memory device 100-3 illustrated in FIG. 6 will be described.

Referring to FIG. 6, a substrate wiring structure 280-3 may further include an upper insulating layer 282 on the second substrate 210 and the first to fifth conductive patterns 280a to 280e. The substrate wiring structure 280-3 may further include sixth to eighth conductive patterns 280f to 280h on the upper insulating layer 282. The substrate wiring structure 280-3 may further include a plurality of vias 280i to 280k penetrating the upper insulating layer 282. The substrate wiring structure 280-3 may be a multilayer structure that includes a layer including the first to fifth conductive patterns 280a to 280e, a layer including the plurality of vias 280i to 280k, and a layer including the sixth to eighth conductive patterns 280f to 280h. The upper insulating layer 282 may be between the first to fifth conductive patterns 280a to 280e and the sixth to eighth conductive patterns 280f to 280h and may surround the plurality of vias 280i to 280k.

The sixth conductive pattern 280f may connect the first conductive pattern 280a to the second conductive pattern 280b. The first via 280i may extend between the first conductive pattern 280a and the sixth conductive pattern 280f to connect the first conductive pattern 280a to the sixth conductive pattern 280f. The second via 280j may extend between the second conductive pattern 280b and the sixth conductive pattern 280f to connect the second conductive pattern 280b to the sixth conductive pattern 280f.

The seventh conductive pattern 280g may be connected to the eighth conductive pattern 280h through the fourth conductive pattern 280d. The third via 280k may extend between the fourth conductive pattern 280d and the seventh conductive pattern 280g to connect the fourth conductive pattern 280d to the seventh conductive pattern 280g. The fourth via 280L may extend between the fourth conductive pattern 280d and the eighth conductive pattern 280h to connect the fourth conductive pattern 280d to the eighth conductive pattern 280h.

The sixth to eighth conductive patterns 280f to 280h and the plurality of vias 280i to 280k may each include a conductive material, e.g., copper (Cu), aluminum (Al), tungsten (W), silver (Ag), or gold (Au). In an implementation, the sixth to eighth conductive patterns 280f to 280h and the plurality of vias 280i to 280k may each further include a barrier material, e.g., titanium (Ti), tantalum (Ta), titanium nitride (TiN), or tantalum nitride (TaN) to help prevent the conductive material from diffusing into the upper insulating layer 282. The upper insulating layer 282 may include silicon oxide, silicon nitride, a low-k material, or an insulating material capable of including a combination thereof.

Figure 7:
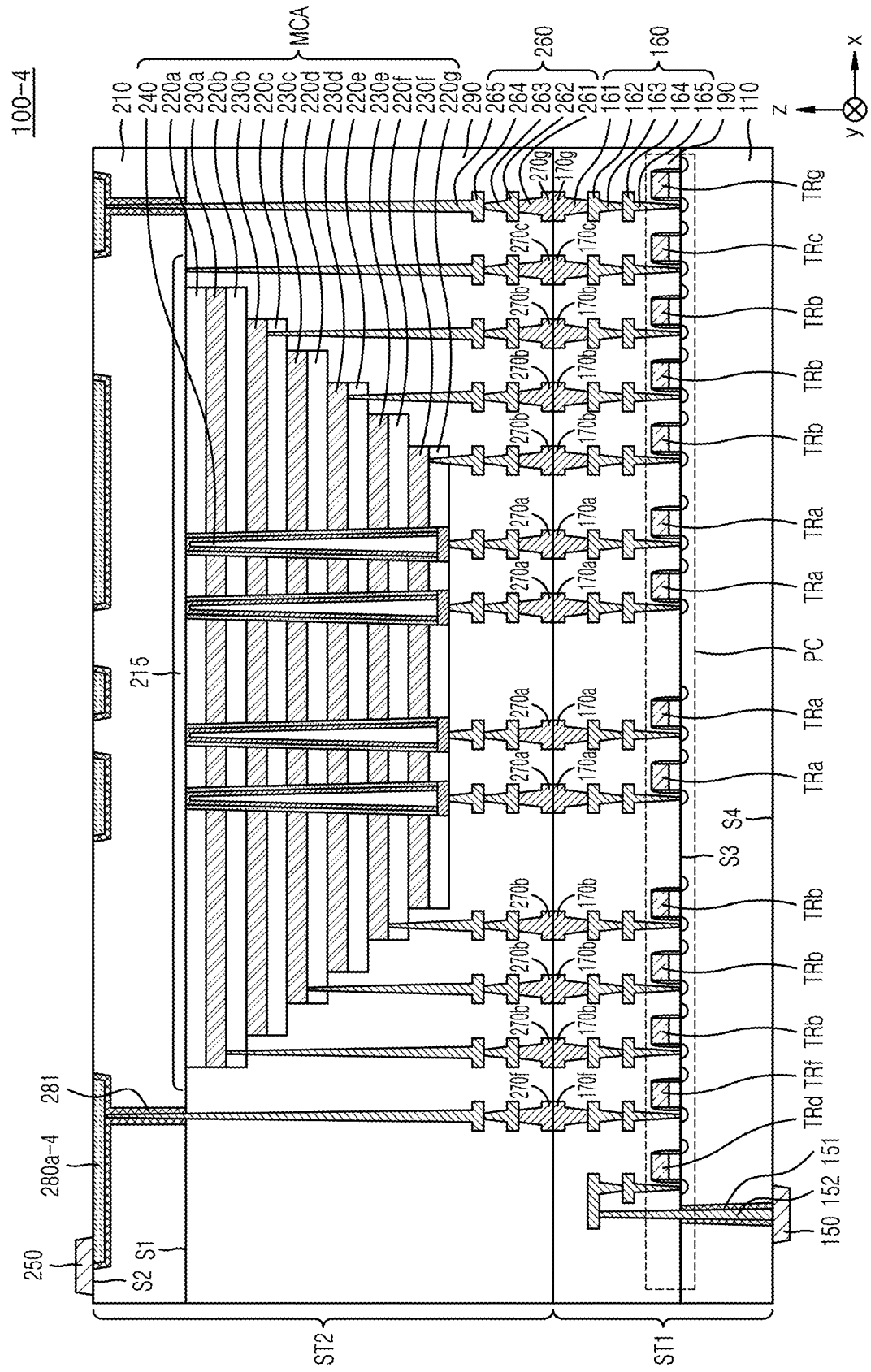
FIG. 7 is a cross-sectional view of a memory device according to an embodiment.

FIG. 7 is a cross-sectional view of a memory device 100-4 according to an embodiment. Hereinafter, a difference between the memory device 100 illustrated in FIG. 2 and the memory device 100-4 illustrated in FIG. 7 will be described.

Referring to FIG. 7, a conductive pattern 280a-4 may be in contact (e.g., direct contact) with the second input/output pad 250. The second input/output pad 250 may be on the conductive pattern 280a-4 and the second surface S2 of the second substrate 210. The conductive pattern 280a-4 may connect the peripheral circuit PC to the second input/output pad 250. Accordingly, the peripheral circuit PC may be connected to a memory controller through the conductive pattern 280a-4 and the second input/output pad 250. In an implementation, the sixth transistor TRf may be connected to the second input/output pad 250 through the first wiring structure 160, the first bonding pad 170*f*, the second bonding pad 270*f*, the second wiring structure 260, and the conductive pattern 280*a*-4.

Figure 8:
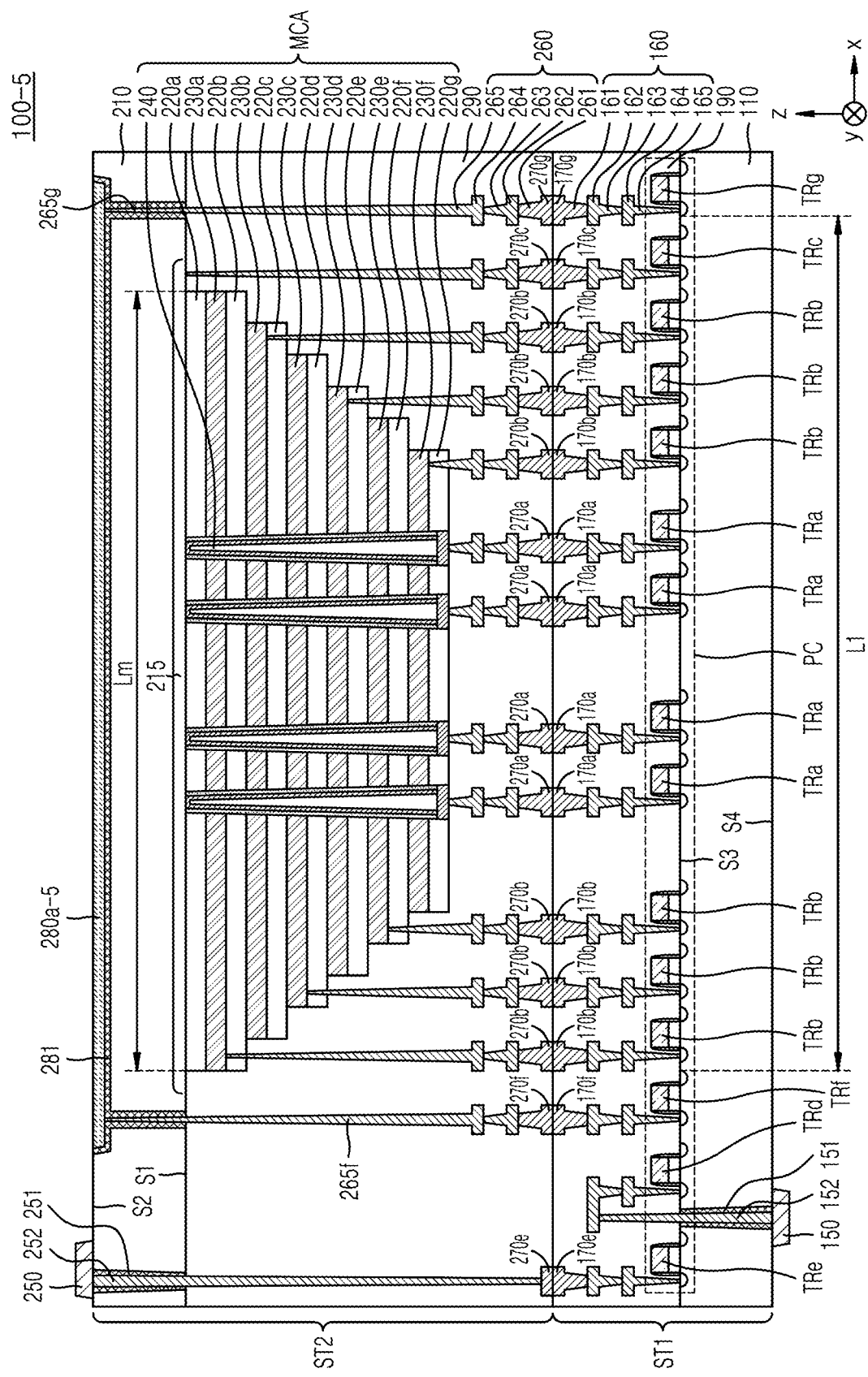
FIG. 8 is a cross-sectional view of a memory device according to an embodiment.

FIG. 8 is a cross-sectional view of a memory device 100-5 according to an embodiment. Hereinafter, a difference between the memory device 100 illustrated in FIG. 2 and the memory device 100-5 illustrated in FIG. 8 will be described.

Referring to FIG. 8, a conductive pattern 280*a*-5 may connect two transistors TRf and TRg in the peripheral circuit PC to each other. In an implementation, the sixth transistor TRf may be connected to the conductive patterns 280*a*-5 through the first wiring structure 160, the first bonding pad 170*f*, the second bonding pad 270*f*, and the second wiring structure 260. In an implementation, a first contact plug 265*f* may partially penetrate the second insulating layer 290 and the second substrate 210 and connect the second bonding pad 270*f* to the conductive pattern 280*a*-5.

In addition, the seventh transistor TRg may be connected to the conductive pattern 280*a*-5 through the first wiring structure 160, the first bonding pad 170*g*, the second bonding pad 270*g*, and the second wiring structure 260. In an implementation, a second contact plug 265*g* may partially penetrate the second insulating layer 290 and the second substrate 210 and connect the second bonding pad 270*g* to the conductive pattern 280*a*-5.

In an implementation, the conductive pattern 280*a*-5 may connect the two transistors TRf and TRg to each other which are relatively far apart from each other. In an implementation, in a plan view, a distance L1 between the sixth transistor TRf and the seventh transistor TRg may be greater than a length Lm in an x direction of the memory cell array MCA.

Figure 9:
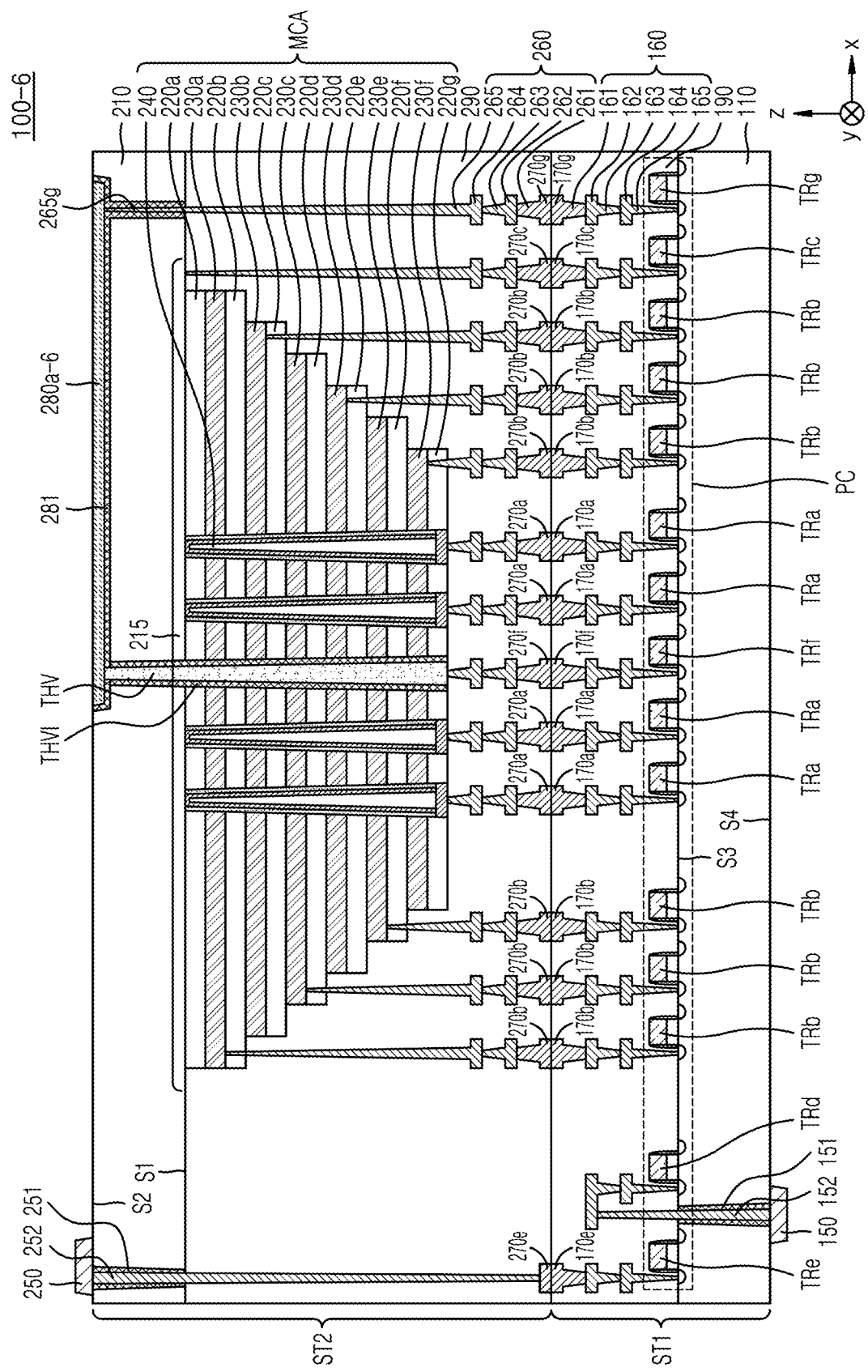
FIG. 9 is a cross-sectional view of a memory device according to an embodiment.

FIG. 9 is a cross-sectional view of a memory device 100-6 according to an embodiment. Hereinafter, a difference between the memory device 100 illustrated in FIG. 2 and the memory device 100-6 illustrated in FIG. 9 will be described.

Referring to FIG. 9, a conductive pattern 280*a*-6 may connect the two transistors TRf and TRg in the peripheral circuit PC to each other. In an implementation, the sixth transistor TRf may be connected to the conductive pattern 280*a*-6 through the first wiring structure 160, the first bonding pad 170*f*, the second bonding pad 270*f*, the second wiring structure 260, and a through-via THV. The through-via THV may penetrate the plurality of interlayer insulating layers 220*a* to 220*g* and the plurality of gate layers 230*a* to 230*f*. The through-via THV may further partially penetrate the second substrate 210. The through-via THV may connect the second bonding pad 270*f* to the conductive pattern 280*a*-6.

The through-via THV may include a semiconductor material, e.g., silicon (Si), germanium (Ge), or silicon (Si)-germanium (Ge); a metallic material, e.g., tungsten (W), titanium (Ti), aluminum (Al), copper (Cu), gold (Au), or silver (Ag), metal nitride such as titanium nitride (TiN) or tantalum nitride (TaN), or a conductive material, e.g., a combination thereof. A via insulating layer THVI may extend between the memory cell array MCA and the through-via THV and between the second substrate 210 and the through-via THV. The via insulating layer THVI may insulate the through-via THV from the memory cell array MCA and the second substrate 210. The via insulating layer THVI may include silicon oxide, silicon nitride, a low-k dielectric material, or an insulating material including a combination thereof.

In an implementation, the seventh transistor TRg may be connected to the conductive pattern 280*a*-6 through the first wiring structure 160, the first bonding pad 170*g*, the second bonding pad 270*g*, and the second wiring structure 260. In an implementation, the second contact plug 265*g* may partially penetrate the second insulating layer 290 and the second substrate 210 to connect the second bonding pad 270*g* to the conductive pattern 280*a*-6.

Figure 10:
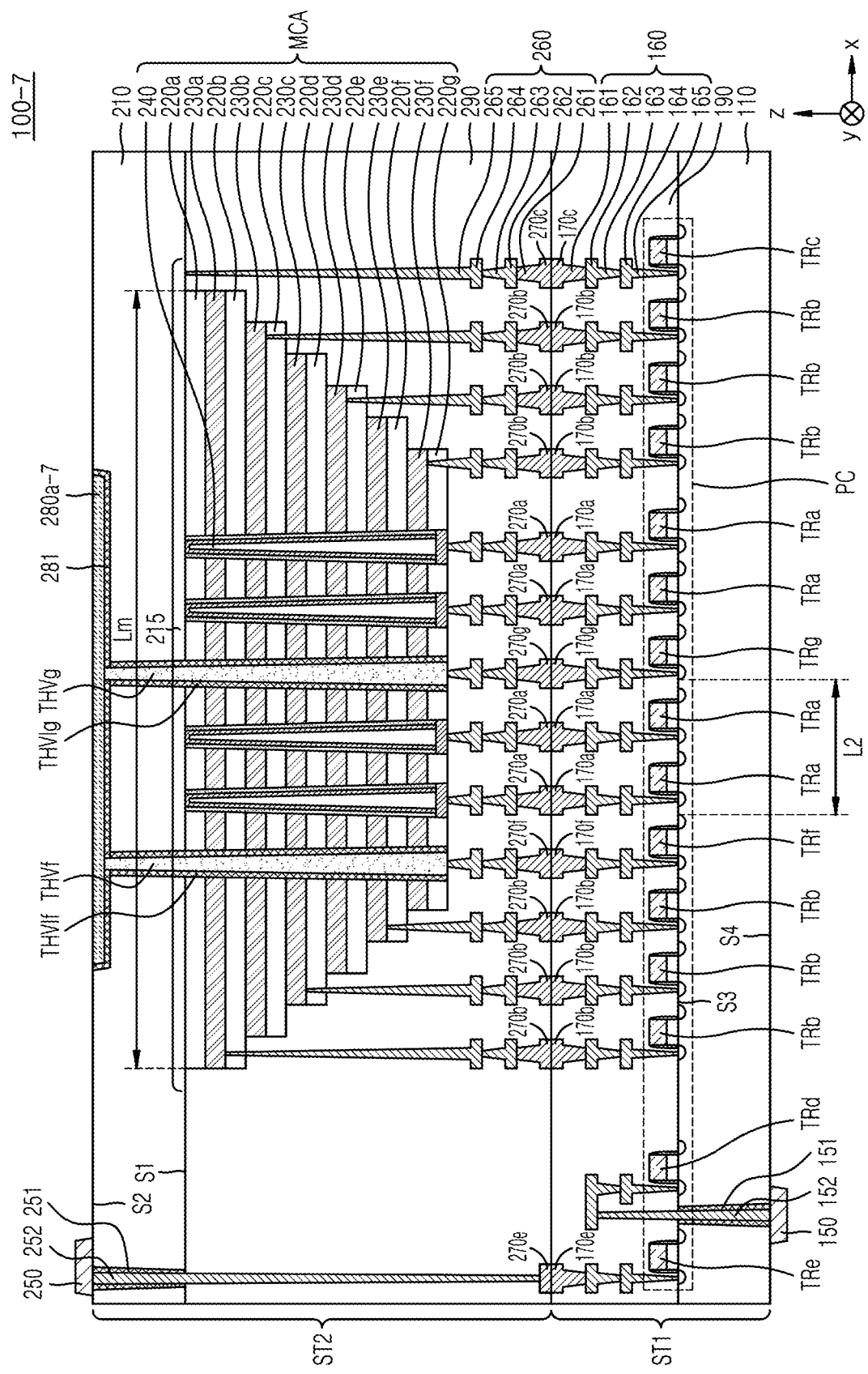
FIG. 10 is a cross-sectional view of a memory device according to an embodiment.

FIG. 10 is a cross-sectional view of a memory device 100-7 according to an embodiment. Hereinafter, a difference between the memory device 100 illustrated in FIG. 2 and the memory device 100-7 illustrated in FIG. 10 will be described.

Referring to FIG. 10, a conductive pattern 280*a*-7 may connect the two transistors TRf and TRg in the peripheral circuit PC to each other. In an implementation, the sixth transistor TRf may be connected to the conductive pattern 280*a*-7 through the first wiring structure 160, the first bonding pad 170*f*, the second bonding pad 270*f*, the second wiring structure 260, and a first through-via THVf. The seventh transistor TRg may be connected to the conductive pattern 280*a*-7 through the first wiring structure 160, the first bonding pad 170*g*, the second bonding pad 270*g*, the second wiring structure 260, and a second through via THVg.

Each of the first through-via THVf and the second through-via THVg may penetrate the plurality of interlayer insulating layers 220*a* to 220*g* and the plurality of gate layers 230*a* to 230*f*. Each of the first through-via THVf and the second through-via THVg may further partially penetrate the second substrate 210. A first via insulating layer THVIf may insulate the first through-via THVf from the memory cell array MCA and the second substrate 210. A second via insulating layer THVIg may insulate the second through via THVg from the memory cell array MCA and the second substrate 210. The first through-via THVf may connect the second bonding pad 270*f* to the conductive pattern 280*a*-7. The second through-via THVg may connect the second bonding pad 270*g* to the conductive pattern 280*a*-7.

In an implementation, the conductive patterns 280*a*-7 may connect the two transistors TRf and TRg to each other which are relatively close to each other. In an implementation, in a plan view, a distance L2 between the sixth transistor TRf and the seventh transistor TRg may be less than the length Lm in the x direction of the memory cell array MCA.

Figure 11:
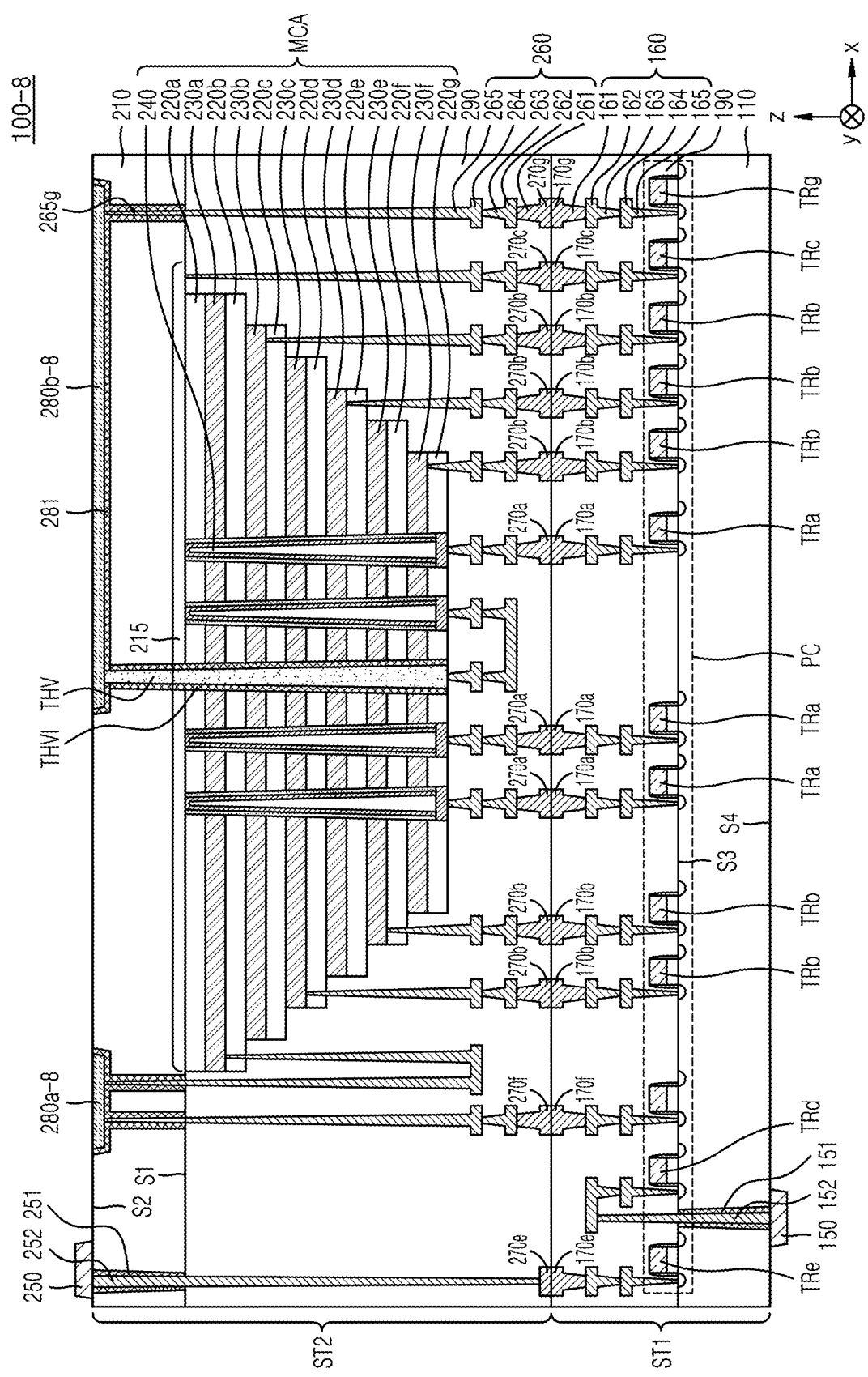
FIG. 11 is a cross-sectional view of a memory device according to an embodiment.

FIG. 11 is a cross-sectional view of a memory device 100-8 according to an embodiment. Hereinafter, a difference between the memory device 100 illustrated in FIG. 2 and the memory device 100-8 illustrated in FIG. 11 will be described.

Referring to FIG. 11, a first conductive pattern 280*a*-8 and a second conductive pattern 280*b*-8 may connect the peripheral circuit PC to the memory cell array MCA. In an implementation, the first conductive pattern 280*a*-8 may connect the sixth transistor TRf to the gate layer 230*a*. In an implementation, the sixth transistor TRf may be connected to the gate layer 230*a* through the first wiring structure 160, the first bonding pad 170*f*, the second bonding pad 270*f*, the second wiring structure 260, and the first conductive pattern 280*a*-8.

In an implementation, the second conductive pattern 280*b*-8 may connect the seventh transistor TRg to the channel structure 240. In an implementation, the seventh transistor TRg may be connected to the channel structure 240 through the first wiring structure 160, the first bonding pad 170g, the second bonding pad 270g, the second wiring structure 260, the second conductive pattern 280b-8, and the through-via THV.

Figure 12:
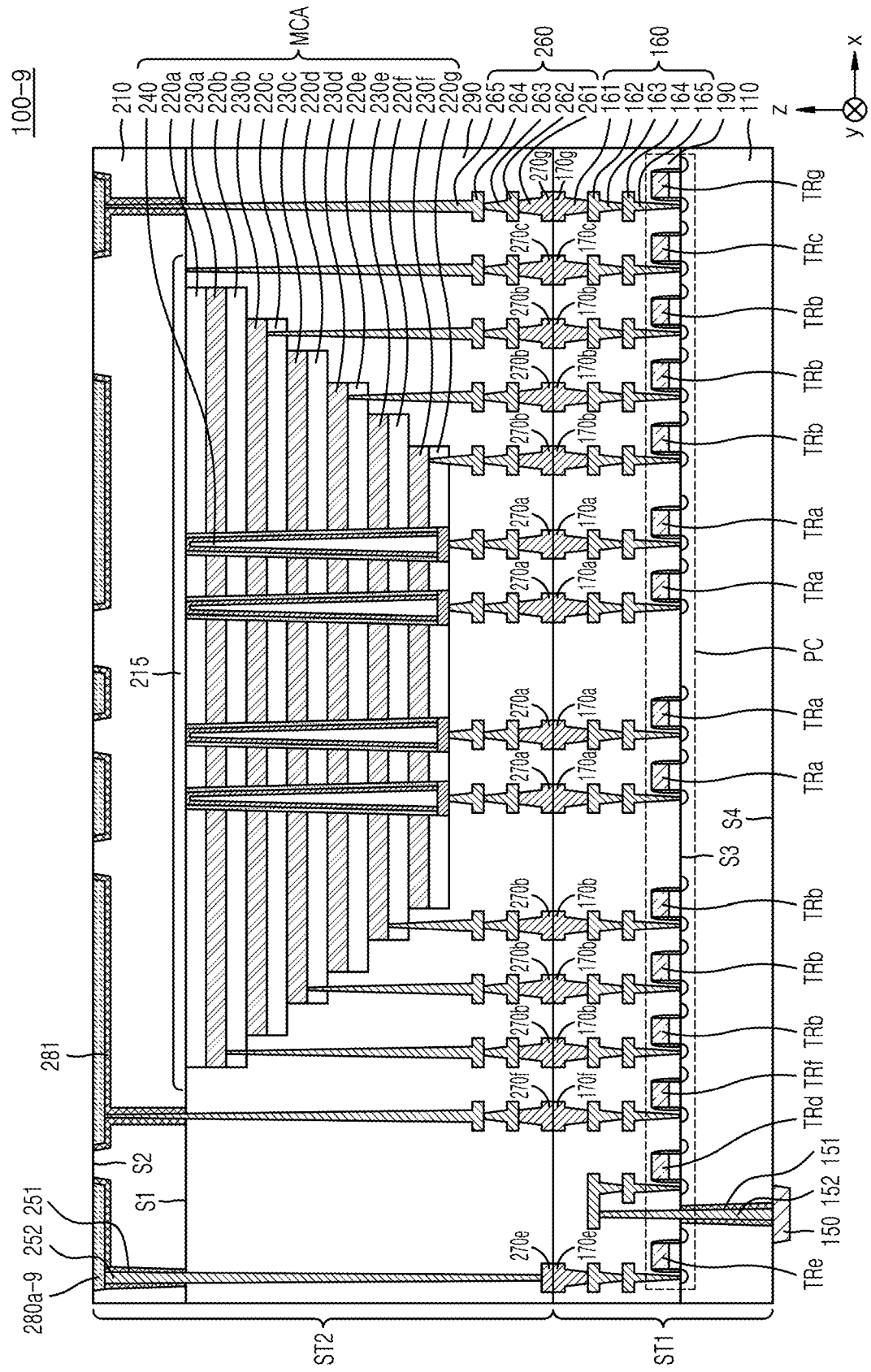
FIG. 12 is a cross-sectional view of a memory device according to an embodiment.

FIG. 12 is a cross-sectional view of a memory device 100-9 according to an embodiment. Hereinafter, a difference between the memory device 100 illustrated in FIG. 2 and the memory device 100-9 illustrated in FIG. 12 will be described.

Referring to FIG. 12, the memory device 100-9 may not include the second input/output pad 250 illustrated in FIG. 2. Instead, a conductive pattern 280a-9 may connect the peripheral circuit PC to a memory controller. In an implementation, the conductive pattern 280a-9 may function as an input/output pad. In an implementation, the fifth transistor TRe may be connected to the conductive pattern 280a-9 through the first wiring structure 160, the first bonding pad 170e, the second bonding pad 270e, and the second input/output contact plug 252.

Figure 13:
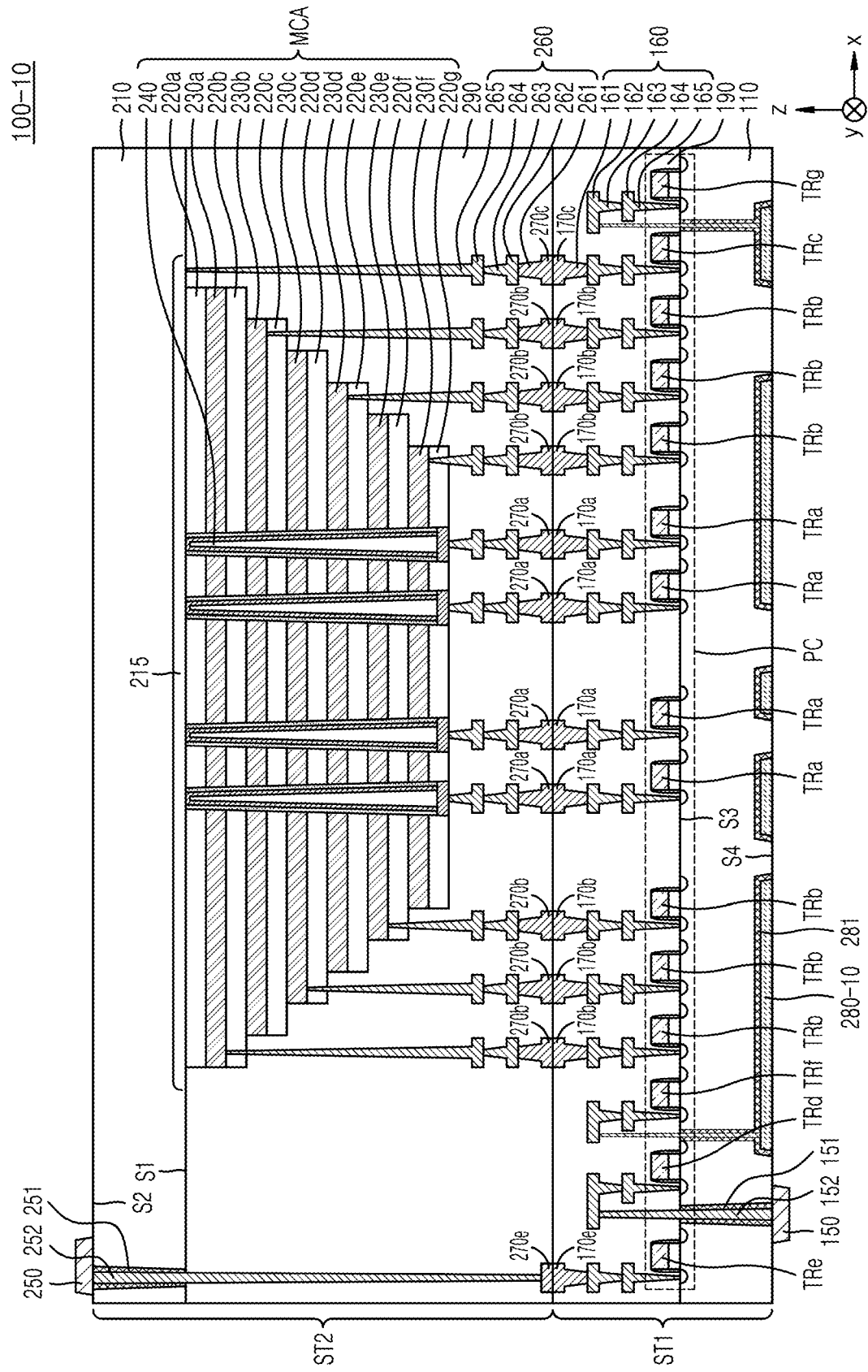
FIG. 13 is a cross-sectional view of a memory device according to an embodiment.

FIG. 13 is a cross-sectional view of a memory device 100-10 according to an embodiment. Hereinafter, a difference between the memory device 100 illustrated in FIG. 2 and the memory device 100-10 illustrated in FIG. 13 will be described.

Referring to FIG. 13, a substrate wiring structure 280-10 may be on the second surface S4 of the first substrate 110. The substrate wiring structure 280-10 may include a plurality of conductive patterns. In an implementation, each conductive pattern may be at least partially recessed from the second surface S4 of the first substrate 110 into the first substrate 110. In an implementation, each conductive pattern may protrude outward from the second surface S4 of the first substrate 110. The substrate wiring structure 280-10 may connect the two transistors TRf and TRg to each other in the peripheral circuit PC.

Figure 14:
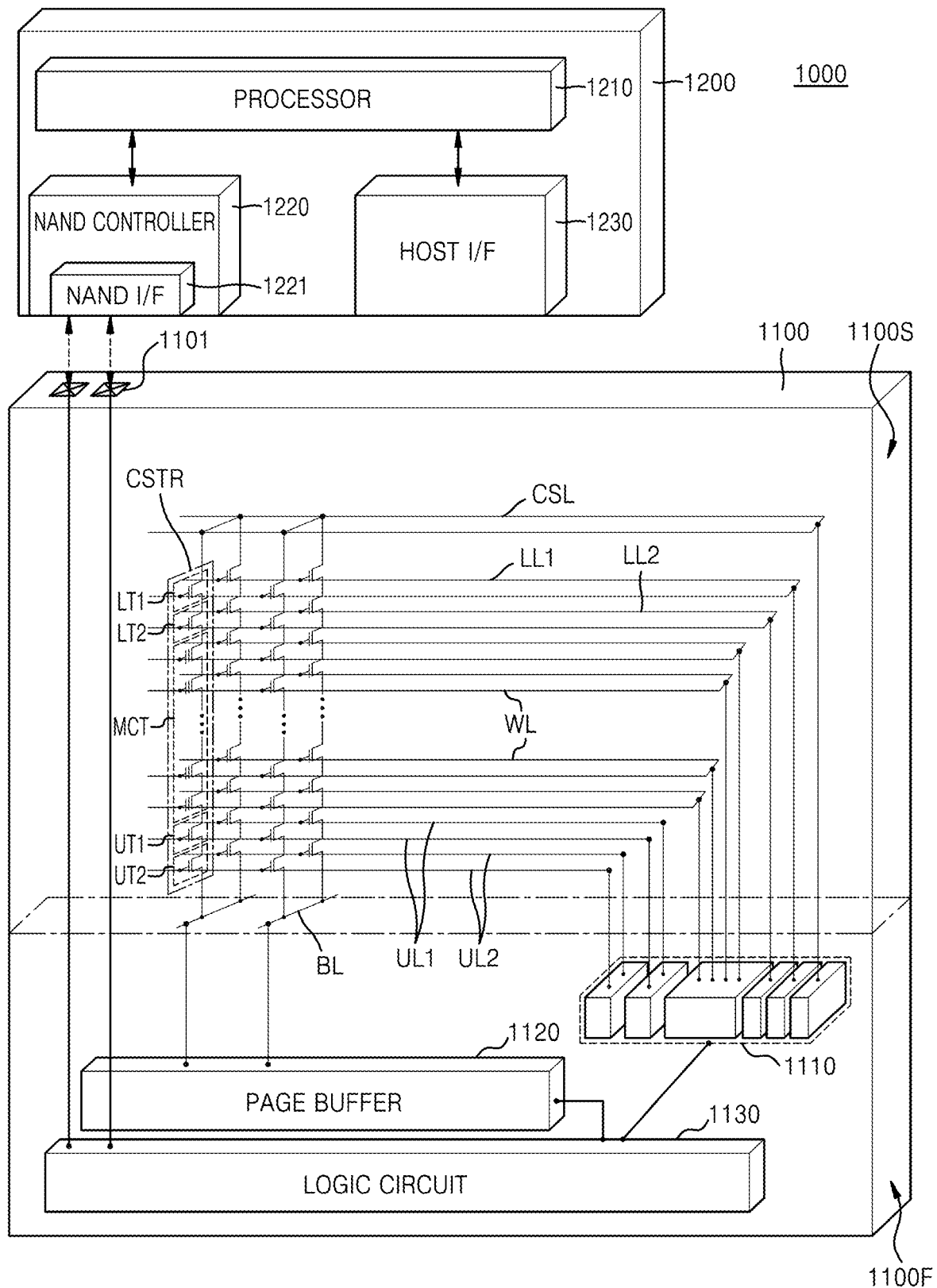
FIG. 14 is a diagram of a data storage system including a memory device, according to an embodiment.

FIG. 14 is a diagram of a data storage system 1000 including a memory device according to an embodiment.

Referring to FIG. 14, the data storage system 1000 may include one or more memory devices 1100 and a memory controller 1200 electrically connected to the memory device 1100. The data storage system 1000 may include, e.g., a solid state drive (SSD) device including at least one memory device 1100, a Universal Serial Bus (USB) device, a computing system, a medical device, or a communication device.

The memory device 1100 may include a nonvolatile memory device. In an implementation, the memory device 1100 may be a NAND flash memory device including one of the nonvolatile memory devices 100, 100-1, 100-2, 100-3, 100-4, 100-5, 100-6, 100-7, 100-8, and 100-9. The memory device 1100 may include a first structure 1100F and a second structure 1100S on the first structure 1100F. The first structure 1100F may be a peripheral circuit structure including a row decoder 1110, a page buffer 1120, and a logic circuit 1130.

The second structure 1100S may be a memory cell structure including a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL. The channel structure 240 and the plurality of gate layers 230a to 230f illustrated in FIGS. 2 to 13 may form a memory cell string CSTR.

In the second structure 1100S, each of the plurality of memory cell strings CSTR may include ground select transistors LT1 and LT2 adjacent to the common source line CSL, string select transistors UT1 and UT2 adjacent to the bit line BL, and a plurality of memory cell transistors MCT between the ground select transistors LT1 and LT2 and the string select transistors UT1 and UT2. The number of ground select transistors LT1 and LT2 and the number of string select transistors UT1 and UT2 may be variously changed according to the embodiments. The channel structure 24 and one of the plurality of gate layers 230a to 230f illustrated in FIGS. 2 to 13 may form one of a plurality of transistors LT1, LT2, UT1, UT2, and MCT.

In an implementation, the plurality of ground select lines LL1 and LL2 may be connected to gate electrodes of the lower transistors LT1 and LT2, respectively. The word lines WL may be connected to the gate electrodes of the memory cell transistors MCT. The plurality of string select lines UL1 and UL2 may be connected to gate electrodes of the string select transistors UT1 and UT2, respectively.

The common source line CSL, the plurality of ground select lines LL1 and LL2, the plurality of word lines WL, and the plurality of string select lines UL1 and UL2 may be connected to the row decoder 1110. The plurality of bit lines BL may be electrically connected to the page buffer 1120.

The memory device 1100 may communicate with the memory controller 1200 through input/output pads 1101 electrically connected to the logic circuit 1130. The input/output pads 1101 may be electrically connected to the logic circuit 1130. The input/output pads 1101 may be the first input/output pads 150 or the second input/output pads 250 illustrated in FIGS. 2 to 11. In an implementation, the input/output pads 1101 may each be the conductive pattern 280a-9 illustrated in FIG. 12.

The memory controller 1200 may include a processor 1210, a NAND controller 1220, and a host interface 1230. In some embodiments, the data storage system 1000 may include a plurality of memory devices 1100, and in this case, the memory controller 1200 may control the plurality of memory devices 1100.

The processor 1210 may control all operations of the data storage system 1000 including the memory controller 1200. The processor 1210 may operate according to predetermined firmware and may access the memory device 1100 by controlling the NAND controller 1220. The NAND controller 1220 may include a NAND interface 1221 for processing communication with the memory device 1100. A control command for controlling the memory device 1100, data to be written to the plurality of memory cell transistors MCT of the memory device 1100, data to be read from the plurality of transistor MCT of the memory device 1100, and so on may be transmitted through the NAND interface 1221. The host interface 1230 may provide a communication function between the data storage system 1000 and an external host. When a control command is received from an external host through the host interface 1230, the processor 1210 may control the memory device 1100 in response to the control command.

Figure 15:
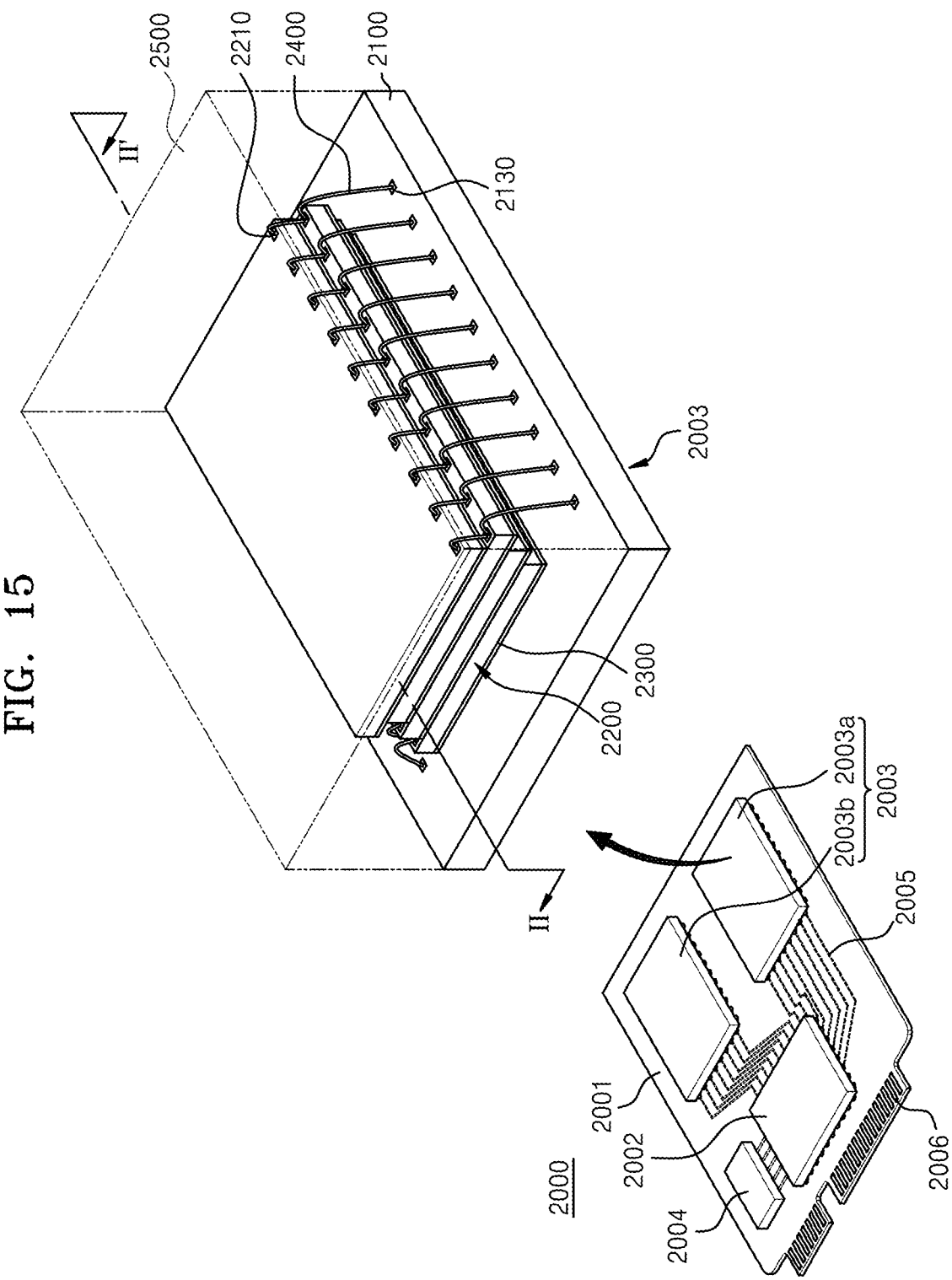
FIG. 15 is a perspective view of a data storage system including a memory device, according to an embodiment.

FIG. 15 is a perspective view of a data storage system 2000 including a memory device, according to an embodiment.

Referring to FIG. 15, the data storage system 2000 according to an example embodiment may include a main board 2001, a memory controller 2002 mounted on the main board 2001, one or more semiconductor packages 2003, and dynamic random access memory (DRAM) 2004. The semiconductor package 2003 and the DRAM 2004 may be connected to the memory controller 2002 by a plurality of wiring patterns 2005 formed on the main board 2001.

The main board 2001 may include a connector 2006 including a plurality of pins coupled to an external host. The number and arrangement of the plurality of pins in the connector 2006 may vary depending on communication interfaces between the data storage system 2000 and an external host. In an implementation, the data storage system 2000 may communicate with an external host according to any one of interfaces such as Universal Serial Bus (USB), peripheral component interconnect express (PCI-Express), serial advanced technology attachment (SATA), and M-Phy for universal flash storage (UFS). In an implementation, the data storage system 2000 may operate with power supplied from an external host through the connector 2006. The data storage system 2000 may further include a power management integrated circuit (PMIC) for distributing power supplied from an external host to the memory controller 2002 and the semiconductor package 2003.

The memory controller 2002 may write data to the semiconductor package 2003 or read data from the semiconductor package 2003 and may increase an operation speed of the data storage system 2000.

The DRAM 2004 may be a buffer memory for reducing a speed difference between the semiconductor package 2003, which is a data storage space, and an external host. The DRAM 2004 included in the data storage system 2000 may also operate as a type of cache memory and may also provide a space for temporarily storing data in a control operation on the semiconductor package 2003. When the DRAM 2004 is included in the data storage system 2000, the memory controller 2002 may further include a DRAM controller for controlling the DRAM 2004 in addition to a NAND controller for controlling the semiconductor package 2003.

The semiconductor package 2003 may include a first semiconductor package 2003a and a second semiconductor package 2003b spaced apart from each other. Each of the first semiconductor package 2003a and the second semiconductor package 2003b may be a semiconductor package including a plurality of semiconductor chips 2200. Each of the first semiconductor package 2003a and the second semiconductor package 2003b may include a package board 2100, a plurality of semiconductor chips 2200 on the package board 2100, an adhesive layer 2300 on a lower surface of each of the plurality of semiconductor chips 2200, connection structures 2400 electrically connecting the plurality of semiconductor chips 2200 to the package board 2100, and a molding layer 2500 covering the plurality of semiconductor chips 2200 and the connection structures 2400 on the package board 2100.

The package board 2100 may be a printed circuit board including a plurality of package upper pads 2130. Each of the plurality of semiconductor chips 2200 may include input/output pads 2210. The input/output pads 2210 may correspond to the input/output pads 1101 of FIG. 13. Each of the plurality of semiconductor chips 2200 may include at least one of the memory devices 100, 100-1, 100-2, 100-3, 100-4, 100-5, 100-6, 100-7, 100-8, 100-9, and 100-10 described with reference to FIGS. 2 to 13.

In an implementation, the connection structures 2400 may be bonding wires electrically connecting the input/output pads 2210 to the package upper pads 2130, respectively. Accordingly, in the first semiconductor package 2003a and the second semiconductor package 2003b, the plurality of semiconductor chips 2200 may be electrically connected to each other by bonding wires and may be electrically connected to the package upper pads 2130 of the package board 2100. In an implementation, in the first semiconductor package 2003a and the second semiconductor package 2003b, the plurality of semiconductor chips 2200 may also be electrically connected to each other by connecting structures including through silicon vias (TSVs) instead of the connection structures 2400 using the bonding wires.

In an implementation, the memory controller 2002 and the plurality of semiconductor chips 2200 may also be included in one package. In an implementation, the memory controller 2002 and the plurality of semiconductor chips 2200 may also be mounted on a separate interposer board different from the main board 2001, and the memory controller 2002 and the plurality of semiconductor chips 2200 may also be connected to each other by wires formed on the interposer board.

Figure 16:
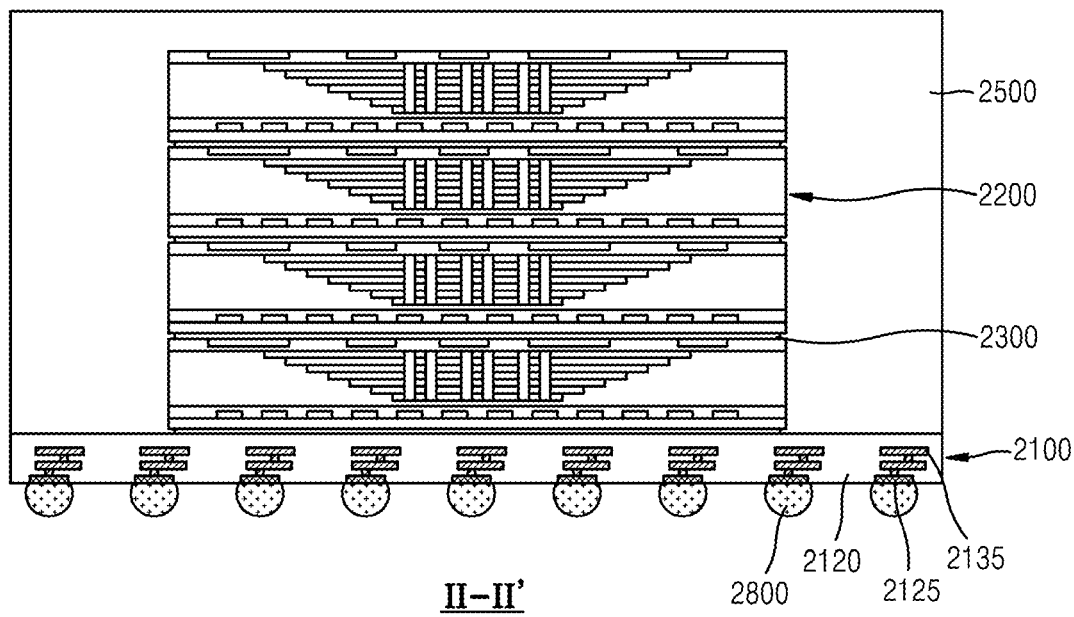
FIG. 16 is a cross-sectional view of a semiconductor package according to an embodiment.

FIG. 16 is a schematic cross-sectional view of the semiconductor package 2003 according to an embodiment. FIG. 16 is a cross-sectional view taken along line II-II' of FIG. 15.

Referring to FIG. 16, the package board 2100 in the semiconductor package 2003 may be a printed circuit board. The package board 2100 may include a package board body portion 2120, a plurality of package upper pads 2130 (see FIG. 15) on an upper surface of the package board body portion 2120, a plurality of lower pads 2125 arranged on a lower surface of the package board body portion 2120 or exposed through the lower surface thereof, and a plurality of internal wires 2135 electrically connecting the plurality of upper pads 2130 (see FIG. 15) to the plurality of lower pads 2125 at an inside of the package board body portion 2120. As illustrated in FIG. 15, the plurality of upper pads 2130 may be electrically connected to the plurality of connection structures 2400. As illustrated in FIG. 16, a plurality of lower pads 2125 may be connected to the plurality of wiring patterns 2005 on the main board 2001 of the data storage system 2000 illustrated in FIG. 15 through a plurality of conductive bumps 2800. Each of the plurality of semiconductor chips 2200 may include the memory devices 100, 100-1, 100-2, 100-3, 100-4, 100-5, 100-6, 100-7, 100-8, 100-9, and 100-10 described with reference to FIGS. 2 to 13.

Figure 17:
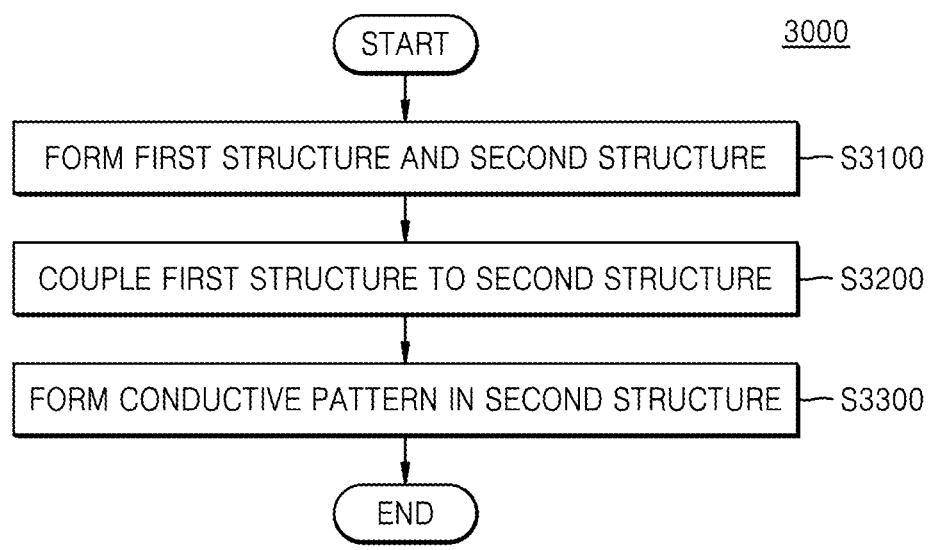
FIG. 17 is a flowchart of a method of manufacturing a memory device, according to an embodiment.

FIG. 17 is a flowchart of a method 3000 of manufacturing a memory device, according to an embodiment.

Referring to FIGS. 17 and 2, the first structure ST1 and the second structure ST2 may be formed (S3100). In an implementation, the peripheral circuit PC may be formed on the first substrate 110. Next, a first wiring structure 160 and the first insulating layer 190 may be formed. Next, the first bonding pads 170a to 170c and 170e to 170g may be formed. Accordingly, the first structure ST1 may be manufactured.

In addition, the memory cell array MCA may be formed on the second substrate 210. In an implementation, the plurality of interlayer insulating layers 220a to 220g and the plurality of sacrificial layers may be alternately stacked on the second substrate 210. Next, the channel structure 240 penetrating the plurality of interlayer insulating layers 220a to 220g and the plurality of sacrificial layers may be formed. Next, the plurality of sacrificial layers may be replaced with the plurality of gate layers 230a to 230f. Accordingly, the memory cell array MCA may be formed. In addition, the second wiring structure 260 and the second insulating layer 290 may be formed. Next, the second bonding pads 270a to 270c and 270e to 270g may be formed. Accordingly, the second structure ST2 may be manufactured.

When the first structure ST1 and the second structure ST2 are prepared, the first structure ST1 may be coupled to the second structure ST2 (S3200). In an implementation, the first structure ST1 comes into contact with the second structure ST2 so that the first bonding pads 170a to 170c and 170e to 170g are in contact with the second bonding pads 270a to 270c and 270e to 270g respectively, and then pressure and/or heat may be applied to the first structure ST1 and the second structure ST2 to bond the first bonding pads 170a to 170c and 170e to 170g to the second bonding pads 270a to 270c and 270e to 270g.

In an implementation, after the first structure ST1 is coupled to the second structure ST2 (S3200), the second surface S4 of the first substrate 110 or the second surface S2 of the second substrate 210 may be ground, and thereby, a thickness of the first substrate 110 and/or a thickness of the second substrate 210 may be reduced.

Next, the substrate wiring structure 280 including the conductive patterns 280a to 280e may be formed in the second structure ST2 (S3300). In an implementation, a recess may be formed on the second surface S2 of the second substrate 210, the insulating pattern 281 may be formed on the recess, and the conductive patterns 280a to 280e may be formed on the insulating pattern 281. In an implementation, the substrate wiring structure 280-10 may be formed in the first structure ST1 as illustrated in FIG. 13.

In an implementation, the first input/output insulating layer 151, the first input/output contact plug 152, and the first input/output pad 150 may be further formed in the first structure ST1. Similarly, the second input/output insulating layer 251, the second input/output contact plug 252, and the second input/output pad 250 may be further formed in the second structure ST2.

By way of summation and review, a first structure may be formed by forming part of a memory device on a first substrate, forming a second structure by forming the rest of the memory device on a second substrate, and coupling the first structure to the second structure, and thus, a memory device having a reduced planar area may be manufactured.

One or more embodiments may provide a memory device including two structures coupled to each other.

One or more embodiments may provide a memory device having a high degree of integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a first structure; and
a second structure on the first structure, wherein:
the first structure includes:
a first substrate;
a peripheral circuit on the first substrate;
a first insulating layer covering the first substrate and the peripheral circuit; and
a first bonding pad on the first insulating layer,
the second structure includes:
a second substrate;
a memory cell array on a first surface of the second substrate;
a second insulating layer directly contacting and covering the first surface of the second substrate and the memory cell array;
a conductive pattern at least partially recessed from a second surface of the second substrate; and
a second bonding pad on the second insulating layer,
the first bonding pad is in contact with the second bonding pad, and
the conductive pattern is spaced apart from the second insulating layer.

2. The memory device as claimed in claim 1, wherein the conductive pattern includes:
a first portion recessed from the second surface of the second substrate, and
a second portion protruding outwardly from the second surface of the second substrate.

3. The memory device as claimed in claim 1, wherein one surface of the conductive pattern is coplanar with the second surface of the second substrate.

4. The memory device as claimed in claim 1, further comprising an insulating pattern between the second substrate and the conductive pattern.

5. The memory device as claimed in claim 1, wherein the conductive pattern overlaps the memory cell array in a plan view.

6. The memory device as claimed in claim 1, wherein the conductive pattern connects the memory cell array to the peripheral circuit.

7. The memory device as claimed in claim 1, wherein the conductive pattern connects two transistors in the peripheral circuit to each other.

8. The memory device as claimed in claim 7, wherein a distance between the two transistors is greater than a length of the memory cell array in one direction, in a plan view.

9. A data storage system, comprising:
the memory device as claimed in claim 1; and
a memory controller configured to control the memory device,
wherein the conductive pattern connects the peripheral circuit to the memory controller.

10. A data storage system, comprising:
the memory device as claimed in claim 1; and
a controller configured to control the memory device, wherein:
the memory device further includes an input/output pad on the second surface of the second substrate, and
the input/output pad connects the peripheral circuit to the controller.

11. A memory device, comprising:
a first structure; and
a second structure on the first structure, wherein:
the first structure includes:
a first substrate;
a peripheral circuit on the first substrate;
a first insulating layer covering the first substrate and the peripheral circuit; and
a first bonding pad on the first insulating layer and connected to the peripheral circuit,
the second structure includes:
a second substrate;
a memory cell array on a first surface of the second substrate;
a second insulating layer directly contacting and covering the first surface of the second substrate and the memory cell array;
a first conductive pattern recessed from a second surface of the second substrate into the second substrate and spaced apart from the second insulating layer; and a second bonding pad on the second insulating layer and connected to the first conductive pattern, the first bonding pad is in contact with the second bonding pad, and the first conductive pattern overlaps the memory cell array in a plan view.

12. The memory device as claimed in claim 11, wherein:

the second structure further includes a second conductive pattern extending from the second surface of the second substrate into the second substrate, and the second conductive pattern does not overlap the memory cell array in a plane view.

13. The memory device as claimed in claim 11, wherein the second structure further includes:

a second conductive pattern on the second surface of the second substrate; and a third conductive pattern on the second surface of the second substrate, the third conductive pattern connecting the first conductive pattern to the second conductive pattern.

14. The memory device as claimed in claim 13, wherein the second structure further includes:

a first via between the first conductive pattern and the third conductive pattern;

a second via between the second conductive pattern and the third conductive pattern; and an upper insulating layer between the second surface of the second substrate and the third conductive pattern, the upper insulating layer surrounding the first via and the second via.

15. The memory device as claimed in claim 11, wherein:

the second structure further includes a third conductive pattern and a fourth conductive pattern on the second surface of the second substrate, and the first conductive pattern connects the third conductive pattern to the fourth conductive pattern.

16. The memory device as claimed in claim 15, wherein the second structure further includes:

a first via between the first conductive pattern and the third conductive pattern;

a second via between the first conductive pattern and the fourth conductive pattern; and an upper insulation layer between the second surface of the second substrate and the third conductive pattern and between the second surface of the second substrate and the fourth conductive pattern, the upper insulation layer surrounding the first via and the second via.

17. A memory device, comprising:

a first structure; and a second structure on the first structure, wherein:

the first structure includes:

a first substrate;

a first transistor and a second transistor on the first substrate;

a first insulating layer covering the first substrate, the first transistor, and the second transistor;

a first bonding pad on the first insulating layer and connected to the first transistor; and a second bonding pad on the first insulating layer and connected to the second transistor, the second structure includes:

a second substrate;

a memory cell array including a plurality of gate layers stacked on a first surface of the second substrate and a plurality of channel structures respectively penetrating the plurality of gate layers;

a second insulating layer directly contacting and covering the first surface of the second substrate and the memory cell array;

a conductive pattern on a second surface of the second substrate or extending at least partially from the second surface of the second substrate into the second substrate and spaced apart from the second insulating layer;

a third bonding pad on the second insulating layer and connected to the conductive pattern; and a fourth bonding pad on the second insulating layer and connected to the conductive pattern, the first bonding pad is in contact with the third bonding pad, and the second bonding pad is in contact with the fourth bonding pad.

18. The memory device as claimed in claim 17, wherein the second structure further includes:

a first contact plug partially penetrating the second insulating layer and connecting the third bonding pad to the conductive pattern; and a second contact plug partially penetrating the second insulating layer and connecting the fourth bonding pad to the conductive pattern.

19. The memory device as claimed in claim 17, wherein the second structure further includes:

a first contact plug partially penetrating the second insulating layer and connecting the third bonding pad to the conductive pattern; and a first through-via penetrating the plurality of gate layers and connecting the fourth bonding pad to the conductive pattern.

20. The memory device as claimed in claim 17, wherein the second structure further includes:

a first through-via penetrating the plurality of gate layers and connecting the fourth bonding pad to the conductive pattern; and a second through-via penetrating the plurality of gate layers and connecting the third bonding pad to the conductive pattern.

* * * * *